(12) United States Patent
Kim et al.

(10) Patent No.: US 12,532,641 B2
(45) Date of Patent: Jan. 20, 2026

(54) DISPLAY PANEL INCLUDING PROTRUSIONS OVERLAPPING FOLDING AREA AND ELECTRONIC DEVICE INCLUDING THE SAME

(71) Applicant: Samsung Display Co., Ltd., Yongin-si (KR)

(72) Inventors: Sangjae Kim, Seongnam-si (KR); Joonggun Chong, Yongin-si (KR); Dong-Hee Lee, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 623 days.

(21) Appl. No.: 17/959,642

(22) Filed: Oct. 4, 2022

(65) Prior Publication Data

US 2023/0200116 A1 Jun. 22, 2023

(30) Foreign Application Priority Data

Dec. 22, 2021 (KR) .................. 10-2021-0185389

(51) Int. Cl.
*H10K 59/80* (2023.01)
*H10K 59/131* (2023.01)
*H10K 59/12* (2023.01)
*H10K 59/122* (2023.01)
*H10K 102/00* (2023.01)

(52) U.S. Cl.
CPC ......... *H10K 59/873* (2023.02); *H10K 59/131* (2023.02); *H10K 59/12* (2023.02); *H10K 59/122* (2023.02); *H10K 2102/311* (2023.02)

(58) Field of Classification Search
CPC .............. H10K 50/844; H10K 50/841; H10K 50/8445; H10K 59/131; H10K 59/124; H10K 59/873; H10K 77/111; G09F 9/301; G09G 3/035
See application file for complete search history.

(56) References Cited

U.S. PATENT DOCUMENTS

| | | | |
|---|---|---|---|
| 10,043,421 B2 * | 8/2018 | Koo | ........................ G09F 9/301 |
| 10,629,845 B2 | 4/2020 | Kim et al. | |
| 10,657,850 B2 * | 5/2020 | Kim | ........................ G09F 9/301 |

(Continued)

FOREIGN PATENT DOCUMENTS

| | | |
|---|---|---|
| KR | 1020160149599 A | 12/2016 |
| KR | 20170049146 A | 5/2017 |

(Continued)

*Primary Examiner* — Ida M Soward
(74) *Attorney, Agent, or Firm* — CANTOR COLBURN LLP

(57) ABSTRACT

An electronic device includes a display panel in which a display area and a non-display area are defined. The display panel includes a base layer in which a first non-folding area, a second non-folding area, and a folding area are defined, a plurality of pixels disposed on the base layer and disposed in the display area, a first protrusion disposed on the base layer and disposed in the non-display area, and a second protrusion that is disposed on the base layer and disposed in the non-display area and that surrounds the first protrusion. A first gap between the first and second protrusions that overlap the first non-folding area is greater than a second gap between the first and second protrusions that overlap the folding area.

19 Claims, 16 Drawing Sheets

(56) References Cited

U.S. PATENT DOCUMENTS

| | | |
|---|---|---|
| 10,879,334 B2 | 12/2020 | Lee et al. |
| 11,139,453 B2* | 10/2021 | Wang .................. H04M 1/0268 |
| 11,439,027 B2* | 9/2022 | Ha ....................... H05K 5/0017 |
| 2017/0033313 A1* | 2/2017 | Kim ..................... H10H 20/853 |
| 2017/0125734 A1* | 5/2017 | Lee ...................... H10K 50/846 |
| 2019/0131575 A1* | 5/2019 | Peng ...................... H10K 50/82 |
| 2021/0333837 A1* | 10/2021 | Xu .......................... F16C 11/12 |

FOREIGN PATENT DOCUMENTS

| | | | |
|---|---|---|---|
| KR | 20190072237 A | 6/2019 | |
| KR | 102018754 B1 | 9/2019 | |
| KR | 20190109690 A | 9/2019 | |
| KR | 102133421 B1 | 7/2020 | |
| KR | 20200082014 A * | 7/2020 | ........... H10D 86/441 |
| KR | 20210075507 A | 6/2021 | |

* cited by examiner

DISPLAY PANEL INCLUDING PROTRUSIONS OVERLAPPING FOLDING AREA AND ELECTRONIC DEVICE INCLUDING THE SAME

This application claims priority to Korean Patent Application No. 10-2021-0185389, filed on Dec. 22, 2021, and all the benefits accruing therefrom under 35 U.S.C. § 119, the content of which in its entirety is herein incorporated by reference.

BACKGROUND

1. Field

Embodiments of the invention described herein relate to a foldable display panel and an electronic device including the same.

2. Description of the Related Art

An electronic device provides information to a user by displaying various images on a display screen. In general, the electronic device displays the information within an allocated screen. Nowadays, flexible electronic devices that include a flexible display panel that can be folded are being developed. Unlike rigid electronic devices, the flexible electronic devices are foldable, rollable, or bendable. The flexible electronic devices having shapes that can be changed in various ways may be carried regardless of sizes of existing screens, and thus user convenience may be improved.

SUMMARY

Embodiments of the invention provide a display panel having improved folding reliability and an electronic device including the display panel.

In an embodiment of the invention, an electronic device includes a display panel in which a display area and a non-display area adjacent to the display area are defined. The display panel includes a base layer in which a first non-folding area, a second non-folding area, and a folding area between the first non-folding area and the second non-folding area are defined, a plurality of pixels disposed on the base layer and disposed in the display area, a first protrusion disposed on the base layer and disposed in the non-display area, and a second protrusion that is disposed on the base layer and disposed in the non-display area and that surrounds the first protrusion. A first gap between the first and second protrusions that overlap the first non-folding area is greater than a second gap between the first and second protrusions that overlap the folding area.

In an embodiment, each of the first gap and the second gap may be a gap between the first protrusion and the second protrusion spaced apart from each other in a direction parallel to a first direction, and the first non-folding area, the folding area, and the second non-folding area may be sequentially defined in a second direction crossing the first direction.

In an embodiment, in a plan view, the first protrusion may be disposed between the display area and the second protrusion and surround the display area.

In an embodiment, the second protrusion may include first protruding portions disposed in the first non-folding area and the second non-folding area, respectively, and a second protruding portion that is disposed in the folding area and that extends from the first protruding portions, and the second protruding portion may be closer to the display area than the first protruding portions are.

In an embodiment, the display panel may further include a drive voltage line that transfers a drive voltage to the plurality of pixels, and the drive voltage line may be disposed in the non-display area.

In an embodiment, in a plan view, the drive voltage line may overlap the first protrusion and the second protrusion.

In an embodiment, portions of the drive voltage line that overlap the first non-folding area and the second non-folding area, respectively, may have a width equal to a width of a portion of the drive voltage line that overlaps the folding area.

In an embodiment, the first protruding portions may overlap an edge of the drive voltage line, and the second protruding portion may be spaced apart from the edge of the drive voltage line and may overlap the drive voltage line.

In an embodiment, portions of the drive voltage line that overlap the first non-folding area and the second non-folding area, respectively, may have a greater width than a portion of the drive voltage line that overlaps the folding area.

In an embodiment, each of the first protruding portions and the second protruding portion may overlap an edge of the drive voltage line.

In an embodiment, an opening may be defined in a portion of the drive voltage line that overlaps the folding area.

In an embodiment, the first protruding portions may overlap an edge of the drive voltage line, and the second protruding portion may overlap a sidewall that defines the opening.

In an embodiment, the sidewall may be spaced farther away from the display area than the second protruding portion is.

In an embodiment, a portion of the first protrusion that faces the first protruding portions and the second protruding portion may have a straight shape extending in a predetermined direction.

In an embodiment, the electronic device may further include a window disposed on the display panel and a lower member disposed under the display panel, and the display panel may further include a first inorganic encapsulation layer that covers the plurality of pixels, the first protrusion, and the second protrusion, an organic encapsulation layer disposed on the first inorganic encapsulation layer, and a second inorganic encapsulation layer disposed on the organic encapsulation layer.

In an embodiment of the invention, a display panel includes a base layer in which a first non-folding area, a second non-folding area, and a folding area between the first non-folding area and the second non-folding area are defined, a plurality of pixels disposed on the base layer, a first protrusion that is disposed on the base layer and that surrounds a display area in which the plurality of pixels is disposed, a second protrusion that is disposed on the base layer and that surrounds the first protrusion, the second protrusion including first protruding portions disposed in the first non-folding area and the second non-folding area, respectively, and a second protruding portion that is disposed in the folding area and that extends from the first protruding portions, the second protruding portion being closer to the display area than the first protruding portions are, and a drive voltage line that transfers a drive voltage to the plurality of pixels and overlaps the first protrusion and the second protrusion in a plan view.

In an embodiment, portions of the drive voltage line that overlap the first non-folding area and the second non-folding area, respectively, may have a width equal to a width of a portion of the drive voltage line that overlaps the folding area, the first protruding portions may overlap an edge of the drive voltage line, and the second protruding portion may be spaced apart from the edge of the drive voltage line and may overlap the drive voltage line.

In an embodiment, portions of the drive voltage line that overlap the first non-folding area and the second non-folding area, respectively, may have a greater width than a portion of the drive voltage line that overlaps the folding area, and each of the first protruding portions and the second protruding portion may overlap an edge of the drive voltage line.

In an embodiment, an opening may be defined in a portion of the drive voltage line that overlaps the folding area, the first protruding portions may overlap an edge of the drive voltage line, and the second protruding portion may overlap a sidewall that defines the opening.

In an embodiment, a portion of the first protrusion that faces the first protruding portions and the second protruding portion may have a straight shape extending in a predetermined direction.

BRIEF DESCRIPTION OF THE DRAWINGS

The above and other objects and features of the invention will become apparent by describing in detail embodiments thereof with reference to the accompanying drawings.

DETAILED DESCRIPTION

Figure 1A:
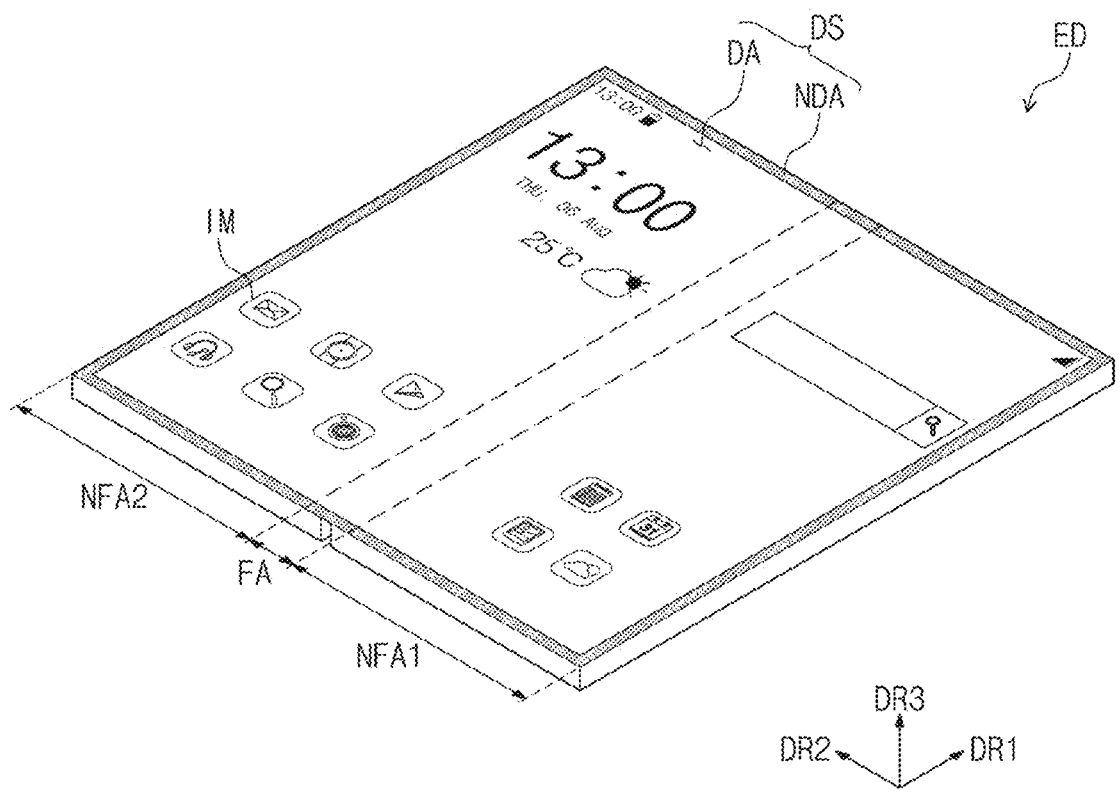
FIGS. 1A and 1B are perspective views of an embodiment of an electronic device according to the invention.

In this specification, when it is mentioned that a component (or, an area, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the invention, a first component may be referred to as a second component, and similarly, the second component may also be referred to as the first component, for example. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms used herein, including technical or scientific terms, have the same meanings as those generally understood by those skilled in the art to which the invention pertains. Such terms as those defined in a generally used dictionary are to be interpreted as having meanings equal to the contextual meanings in the relevant field of art, and are not to be interpreted as having ideal or excessively formal meanings unless clearly defined as having such in the application.

Hereinafter, embodiments of the invention will be described with reference to the accompanying drawings.

Figure 1B:
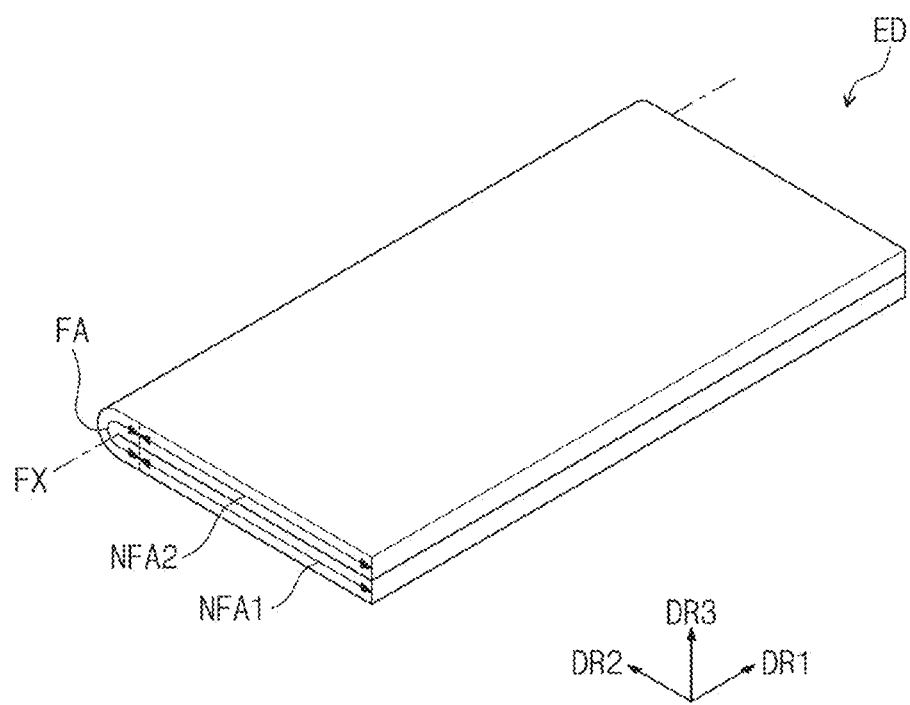

FIGS. 1A and 1B are perspective views of an embodiment of an electronic device ED according to the invention. FIG. 1A illustrates a flat state (or, an unfolded state) of the electronic device ED, and FIG. 1B illustrates a folded state of the electronic device ED.

Referring to FIGS. 1A and 1B, the electronic device ED in an embodiment of the invention may include a display surface DS defined by a first direction DR1 and a second direction DR2 crossing the first direction DR1. The electronic device ED may provide an image IM to a user through the display surface DS.

The display surface DS may include a display area DA and a non-display area NDA around the display area DA. The display area DA may display the image IM, and the non-display area NDA may not display the image IM. The non-display area NDA may surround the display area DA. However, without being limited thereto, the shape of the display area DA and the shape of the non-display area NDA may be modified.

Hereinafter, a direction substantially perpendicular to a plane defined by the first direction DR1 and the second direction DR2 is defined as a third direction DR3 Furthermore, the expression "in the plan view" used herein may mean that it is viewed in the third direction DR3.

The electronic device ED may include a folding area FA and a plurality of non-folding areas NFA1 and NFA2. The non-folding areas NFA1 and NFA2 may include the first non-folding area NFA1 and the second non-folding area NFA2. The folding area FA may be disposed between the first non-folding area NFA1 and the second non-folding area NFA2. The first non-folding area NFA1, the folding area FA, and the second non-folding area NFA2 may be sequentially defined in the electronic device ED in the second direction DR2.

As illustrated in FIG. 1B, the folding area FA may be folded about a folding axis FX parallel to the first direction DR1. The folding area FA may extend in the first direction DR1. The folding area FA has a predetermined curvature and a predetermined radius of curvature. The electronic device ED may be folded in an in-folding manner such that the first non-folding area NFA1 and the second non-folding area NFA2 face each other and the display surface DS is not exposed to the outside.

In an embodiment of the invention, the electronic device ED may be folded in an out-folding manner such that the display surface DS is exposed to the outside. In an embodiment of the invention, the electronic device ED may be configured such that both an in-folding motion and an out-folding motion are able to be performed in a flat state. However, the invention is not limited thereto.

Although FIGS. 1A and 1B illustrate an example that the electronic device ED has only one folding area FA, the invention is not limited thereto. In an embodiment, the electronic device ED may be a multi-foldable electronic device ED. In this case, a plurality of folding areas FA may be provided, for example. The plurality of folding areas may be defined to be spaced apart from each other. Descriptions to be described below may be applied to the folding areas of the multi-foldable electronic device.

Figure 2:
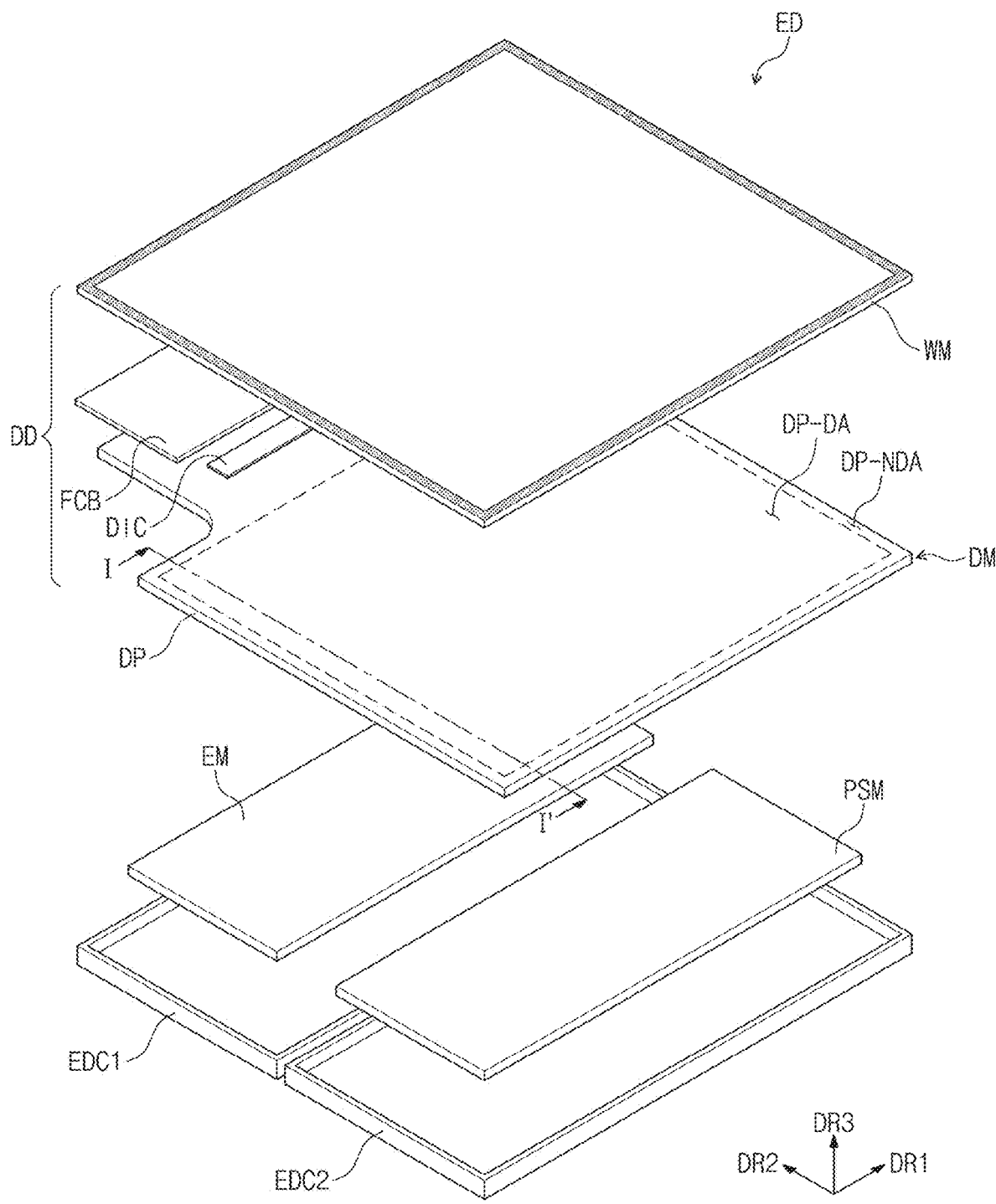
FIG. 2 is an exploded perspective view of an embodiment of the electronic device according to the invention.

FIG. 2 is an exploded perspective view of an embodiment of the electronic device ED according to the invention.

Referring to FIG. 2, the electronic device ED may include a display device DD, an electronic module EM, a power supply module PSM, and cases EDC1 and EDC2. Although not separately illustrated, the electronic device ED may further include a mechanical structure for controlling a folding motion of the display device DD.

The display device DD generates an image and senses an external input. The display device DD includes a window module WM and a display module DM. The window module WM provides the front surface of the electronic device ED.

The display module DM may include at least a display panel DP. Although the display module DM is illustrated as being the same as the display panel DP in FIG. 2, the display module DM may be a stacked structure having a plurality of components stacked one above another. The stacked structure of the display module DM will be described below in detail.

The display panel DP includes a display area DP-DA and a non-display area DP-NDA that respectively correspond to the display area DA (refer to FIG. 1A) and the non-display area NDA (refer to FIG. 1A) of the electronic device ED. The expression "one area/portion corresponds to another area/portion" used herein may mean that the areas/portions overlap each other and is not limited to having the same area. The display module DM may include a driver integrated circuit ("IC") DIC disposed on the non-display area DP-NDA. The display module DM may further include a flexible circuit film FCB coupled to the non-display area DP-NDA.

The driver IC DIC may include drive elements (e.g., a data drive circuit) for driving pixels of the display panel DP. Although FIG. 2 illustrates the structure in which the driver IC DIC is disposed (e.g., mounted) on the display panel DP, the invention is not limited thereto. In an embodiment, the driver IC DIC may be disposed (e.g., mounted) on the flexible circuit film FCB, for example.

The electronic module EM includes at least a main driver. The electronic module EM may include a wireless communication module, a camera module, a proximity sensor module, an image input module, a sound input module, a sound output module, a memory, and an external interface module. The electronic module EM is electrically connected with the power supply module PSM.

The main driver (or, the main controller) controls overall operation of the electronic device ED. In an embodiment, the main driver activates or deactivates the display device DD in response to a user input, for example. The main driver may control operations of the display device DD and other modules. In an embodiment, the main driver may include at least one microprocessor.

The cases EDC1 and EDC2 accommodate the display module DM, the electronic module EM, and the power supply module PSM. Although the two cases EDC1 and EDC2 separated from each other are illustrated, the invention is not limited thereto. Although not illustrated, the electronic device ED may further include a hinge structure for connecting the two cases EDC1 and EDC2. The cases EDC1 and EDC2 may be coupled with the window module WM. The cases EDC1 and EDC2 protect components (e.g., the display module DM, the electronic module EM, the power supply module PSM, or the like) accommodated in the cases EDC1 and EDC2.

Figure 3:
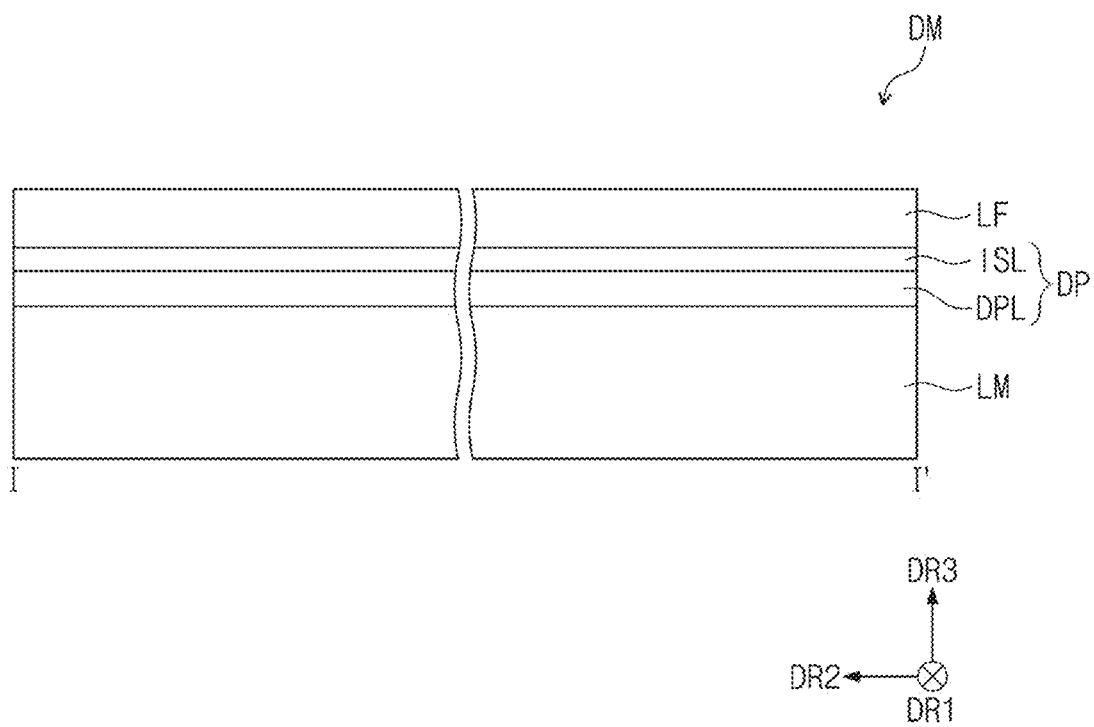
FIG. 3 is a cross-sectional view taken along line I-I' of FIG. 2.

FIG. 3 is a cross-sectional view taken along line I-I' of FIG. 2.

Referring to FIG. 3, the display module DM may include the display panel DP, an optical film LF disposed on the display panel DP, and a lower member LM disposed under the display panel DP. The display panel DP may include a display layer DPL and a sensor layer ISL disposed on the display layer DPL. An adhesive layer may be disposed between the members as desired.

The display layer DPL may be a component that substantially generates an image. The display layer DPL may be an emissive display layer. In an embodiment, the display layer DPL may be an organic light-emitting display layer, an inorganic light-emitting display layer, an organic-inorganic light-emitting display layer, a quantum dot display layer, a micro-light emitting diode ("micro-LED") display layer, or a nano-LED display layer, for example.

The sensor layer ISL may be disposed on the display layer DPL. The sensor layer ISL may sense an external input applied from the outside. The sensor layer ISL may be an external sensor attached to the display layer DPL. The sensor layer ISL may be an integrated sensor continuously formed in a manufacturing process of the display layer DPL.

The optical film LF may lower the reflectivity of light incident from the outside. The optical film LF may include a phase retarder and/or a polarizer. In an embodiment, the optical film LF may include at least a polarizer film.

The optical film LF may include color filters. The color filters may have a predetermined arrangement. The arrangement of the color filters may be determined in consideration of the light emission colors of pixels PX included in the display layer DPL. In addition, the optical film LF may further include a black matrix adjacent to the color filters.

The optical film LF may include a destructive interference structure. In an embodiment, the destructive interference structure may include a first reflective layer and a second reflective layer disposed on different layers, for example. First reflected light and second reflected light reflected from the first reflective layer and the second reflective layer, respectively, may destructively interfere with each other, and thus the reflectivity of external light may be decreased.

The lower member LM may include various functional members. The lower member LM may include a light-blocking layer that blocks light incident on the display layer DPL, a shock absorbing layer that absorbs external shocks, a support layer that supports the display layer DPL, a heat radiating layer that radiates heat generated from the display layer DPL, a digitizer that senses an input of a pen (e.g., an electronic pen), or the like.

Figure 4:
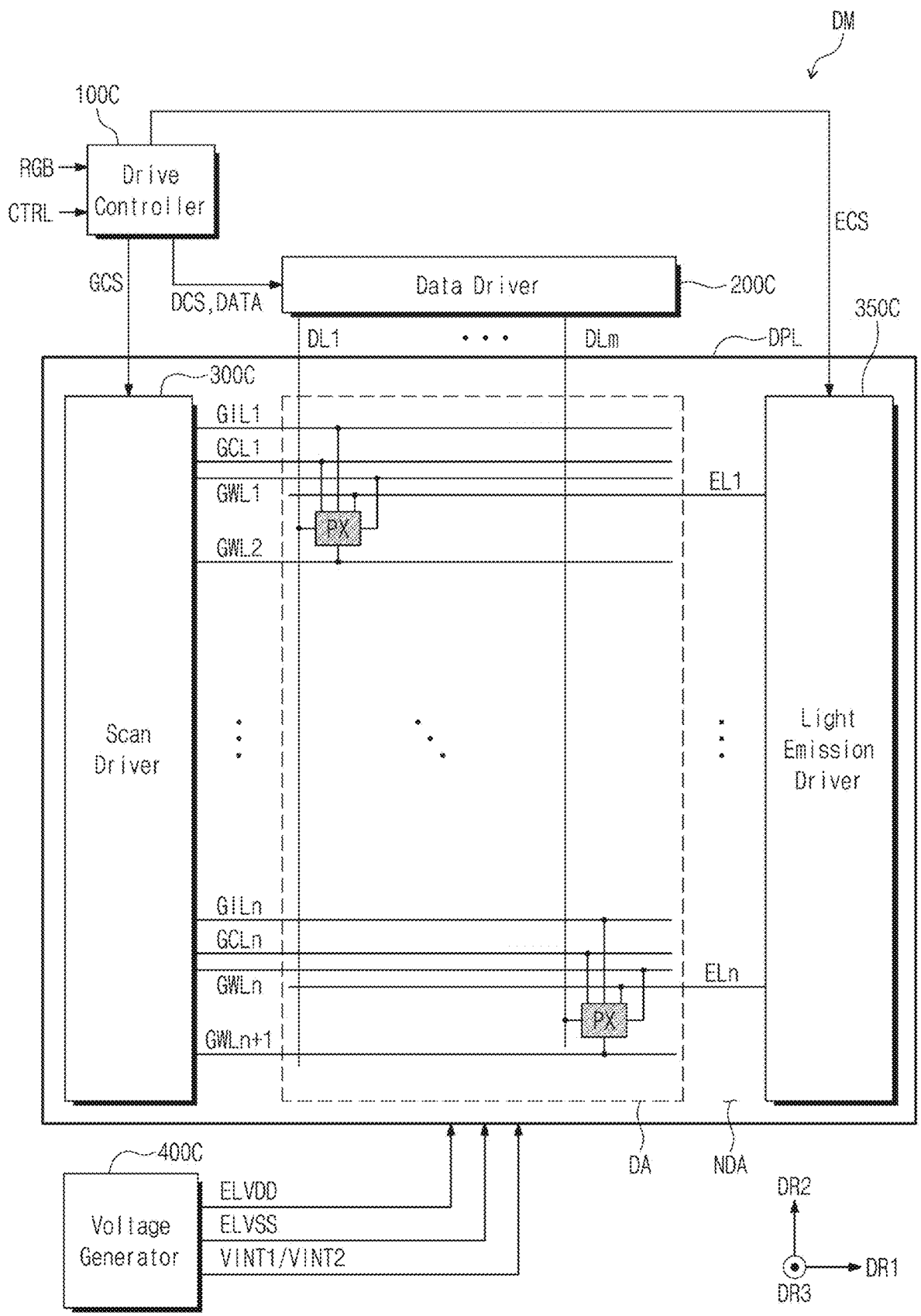
FIG. 4 is a block diagram of an embodiment of the display module according to the invention.

FIG. 4 is a block diagram of an embodiment of the display module DM according to the invention.

Referring to FIG. 4, the display module DM includes the display layer DPL, a panel driver, and a drive controller 100C. In an embodiment of the invention, the panel driver may include a data driver 200C, a scan driver 300C, a light emission driver 350C, and a voltage generator 400C.

The drive controller 100C receives an image signal RGB and a control signal CTRL. The drive controller 100C generates an image data signal DATA by converting the data format of the image signal RGB according to the specification of an interface with the data driver 200C. The drive controller 100C outputs a first control signal GCS, a second control signal ECS, and a third control signal DCS.

The data driver 200C receives the third control signal DCS and the image data signal DATA from the drive controller 100C. The data driver 200C converts the image data signal DATA into data signals and outputs the data signals to a plurality of data lines DL1 to DLm to be described below. The data signals are analog voltages corresponding to the gray level value of the image data signal DATA. Here, n and m are natural numbers.

The scan driver 300C receives the first control signal GCS from the drive controller 100C. The scan driver 300C may output scan signals to scan lines in response to the first control signal GCS.

The voltage generator 400C generates voltages desired for operation of the display layer DPL. In this embodiment, the voltage generator 400C may generate a first drive voltage ELVDD, a second drive voltage ELVSS, a first initialization voltage VINT1, and a second initialization voltage VINT2.

The display layer DPL may include a display area DA and a non-display area NDA. The display layer DPL may include a plurality of pixels PX disposed in the display area DA. The plurality of pixels PX may be arranged according to a predetermined rule.

The display layer DPL further includes the data lines DL1 to DLm, the scan lines, and light emission control lines EL1 to ELn. The scan lines may include initialization scan lines GIL1 to GILn, compensation scan lines GCL1 to GCLn, and write scan lines GWL1 to GWLn+1.

The data lines DL1 to DLm extend in the second direction DR2 and are arranged to be spaced apart from each other in the first direction DR1. The initialization scan lines GIL1 to GILn, the compensation scan lines GCL1 to GCLn, the write scan lines GWL1 to GWLn+1, and the light emission control lines EL1 to ELn extend in the first direction DR1. The initialization scan lines GIL1 to GILn, the compensation scan lines GCL1 to GCLn, the write scan lines GWL1 to GWLn+1, and the light emission control lines EL1 to ELn are arranged to be spaced apart from each other in the second direction DR2.

The plurality of pixels PX is electrically connected to the initialization scan lines GIL1 to GILn, the compensation scan lines GCL1 to GCLn, the write scan lines GWL1 to GWLn+1, the light emission control lines EL1 to ELn, and the data lines DL1 to DLm. Each of the plurality of pixels PX may be electrically connected to four scan lines. In an embodiment, as illustrated in FIG. 4, the pixels PX in the first row may be connected to the first initialization scan line GIL1 the first compensation scan line GCL1, the first write scan line GWL1, and the second write scan line GWL2, for example. The pixels in the first row may be connected to a write scan line (e.g., the second write scan line GWL2) connected to the pixels in the next row. Furthermore, the pixels PX in the $n^{th}$ row may be connected to the $n^{th}$ initialization scan line GILn, the $n^{th}$ compensation scan line GCLn, the $n^{th}$ write scan line GWLn, and the $(n+1)^{th}$ write scan line GWLn+1. However, this is illustrative, and a connection relationship between the plurality of pixels PX and the initialization scan lines GIL1 to GILn, the compensation scan lines GCL1 to GCLn, the write scan lines GWL1 to GWLn+1, the light emission control lines EL1 to ELn, and the data lines DL1 to DLm is not limited to the embodiment of FIG. 4.

The scan driver 300C may be disposed in the non-display area NDA of the display layer DPL. The scan driver 300C receives the first control signal GCS from the drive controller 100C. In response to the first control signal GCS, the scan driver 300C outputs initialization scan signals to the initialization scan lines GIL1 to GILn and outputs compensation scan signals to the compensation scan lines GCL1 to GCLn. Furthermore, the scan driver 300C may output write scan signals to the write scan lines GWL1 to GWLn+1 in response to the first control signal GCS. In an alternative embodiment, the scan driver 300C may include first and second scan drivers. The first scan driver may output the initialization scan signals and the compensation scan signals, and the second scan driver may output the write scan signals.

The light emission driver 350C may be disposed in the non-display area NDA of the display layer DPL. The light emission driver 350C receives the second control signal ECS from the drive controller 100C. The light emission driver 350C may output light emission control signals to the light emission control lines EL1 to ELn in response to the second control signal ECS. In an alternative embodiment, the scan driver 300C may be connected to the light emission control lines EL1 to ELn. In this case, the scan driver 300C may output light emission control signals to the light emission control lines EL1 to ELn.

Figure 5A:
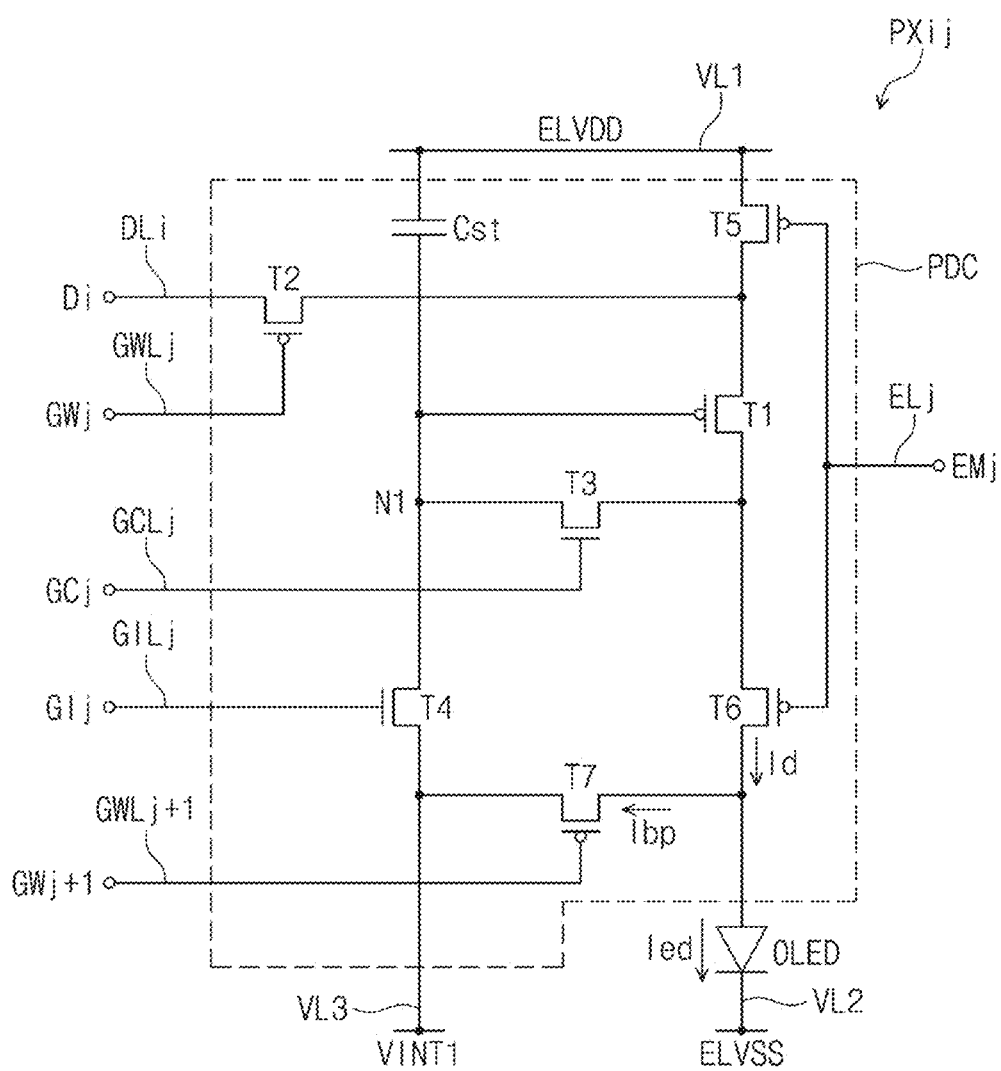
FIG. 5A is a circuit diagram illustrating an embodiment of a pixel according to the invention.
Figure 5B:
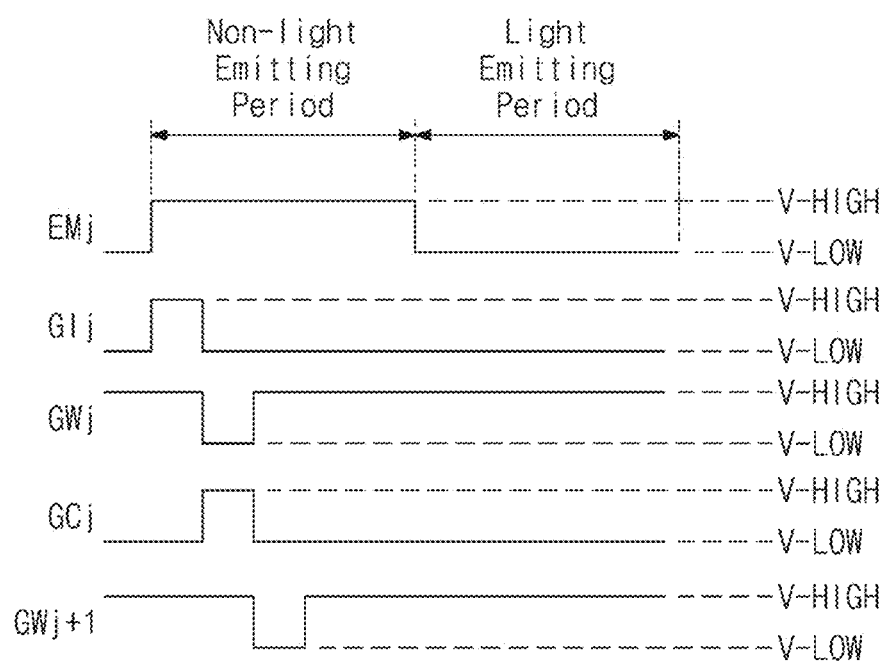
FIG. 5B is a waveform diagram of drive signals for driving the pixel illustrated in FIG. 5A.

FIG. 5A is a circuit diagram illustrating an embodiment of a pixel PXij according to the invention. FIG. 5B is a waveform diagram of drive signals for driving the pixel illustrated in FIG. 5A.

In FIG. 5A, an equivalent circuit diagram of one pixel PXij among the plurality of pixels PX illustrated in FIG. 4 is illustrated. As each of the plurality of pixels PX has the same circuit structure, description of the circuit structure for the pixel PXij may be applied to the remaining pixels, and detailed description of the remaining pixels will be omitted.

Referring to FIGS. 5A and 5B, the pixel PXij is connected to the $i^{th}$ data line DLi, the $j^{th}$ initialization scan line GILj, the $j^{th}$ compensation scan line GCLj, the $j^{th}$ write scan line GWLj, the $(j+1)^{th}$ write scan line GWLj+1, and the $j^{th}$ light emission control line ELj. Here, j is a natural number equal to or less than n, and i is a natural number equal to or less than m.

The pixel PXij includes a light-emitting element OLED and a pixel drive circuit PDC. The light-emitting element OLED may be a light-emitting diode. In an embodiment of the invention, the light-emitting element OLED may be an organic light-emitting diode including an organic light-emitting layer.

The pixel drive circuit PDC may include first to seventh transistors T1, T2, T3, T4, T5, T6, and T7 and one storage capacitor Cst. The first to seventh transistors T1, T2, T3, T4, T5, T6, and T7 may be also referred to as the drive thin film transistor T1, the switching thin film transistor T2, the compensation thin film transistor T3, the first initialization thin film transistor T4, the operation control thin film transistor T5, the light emission control thin film transistor T6, and the second initialization thin film transistor T7, respectively.

Some of the first to seventh transistors T1, T2, T3, T4, T5, T6, and T7 may be P-type transistors, and the others may be N-type transistors. In an embodiment, the first, second, fifth, sixth, and seventh transistors T1, T2, T5, T6, and T7 may be p-type metal-oxide semiconductor ("PMOS") transistors, and the third and fourth transistors T3 and T4 may be n-type metal-oxide semiconductor ("NMOS") transistors, for example.

At least one of the first to seventh transistors T1, T2, T3, T4, T5, T6, and T7 may be a transistor having a low-temperature polycrystalline silicon ("LTPS") semiconductor layer, and at least one other transistor among the first to seventh transistors T1, T2, T3, T4, T5, T6, and T7 may be a transistor having an oxide semiconductor layer.

Specifically, the first transistor T1 directly affecting the brightness of the display device may include a semiconductor layer including polycrystalline silicon having high reliability, and thus the display device may be implemented to have a high resolution.

An oxide semiconductor has high carrier mobility and low leakage current, and therefore a voltage drop is not great even though operating time is long. That is, the color of an image is not greatly changed depending on a voltage drop even during low-frequency operation, and therefore low-frequency operation is possible. Because the oxide semiconductor has an advantage of low leakage current as described above, at least one of the third transistor T3, which is connected with the drive gate electrode of the first transistor T1, or the fourth transistor T4 may be employed as an oxide semiconductor to reduce power consumption while preventing leakage current that is likely to flow to the drive gate electrode.

The first, second, fifth, sixth, and seventh transistors T1, T2, T5, T6, and T7 may be transistors having a low-temperature polycrystalline silicon semiconductor layer, and the third and fourth transistors T3 and T4 may be transistors having an oxide semiconductor layer.

The configuration of the pixel drive circuit PDC according to the invention is not limited to the embodiment illustrated in FIG. 5A. The pixel drive circuit PDC illustrated in FIG. 5A is merely one of embodiments, and various changes and modifications may be made to the configuration of the pixel drive circuit PDC. In an embodiment, the first to seventh transistors T1, T2, T3, T4, T5, T6, and T7 may all be P-type transistors or N-type transistors, for example.

The $j^{th}$ initialization scan line GILj, the $j^{th}$ compensation scan line GCLj, the $j^{th}$ write scan line GWLj, the $(j+1)^{th}$ write scan line GWLj+1, and the $j^{th}$ light emission control line ELj may transfer, to the pixel PXij, the $j^{th}$ initialization scan signal GIj, the $j^{th}$ compensation scan signal GCj, the $j^{th}$ write scan signal GWj, the $(j+1)^{th}$ write scan signal GWj+1, and the $j^{th}$ light emission control signal EMj, respectively. The $i^{th}$ data line DLi transfers the $i^{th}$ data signal Di to the pixel PXij. The $i^{th}$ data signal Di may have a voltage level corresponding to the image signal RGB (refer to FIG. 4) that is input to the display module DM (refer to FIG. 4).

A first drive voltage line VL1 and a second drive voltage line VL2 may transfer, to the pixel PXij, the first drive voltage ELVDD and the second drive voltage ELVSS, respectively. Furthermore, a first initialization voltage line VL3 may transfer the first initialization voltage VINT1 to the pixel PXij.

The first transistor T1 is connected between the first drive voltage line VL1 receiving the first drive voltage ELVDD and the light-emitting element OLED. The first transistor T1 may receive the $i^{th}$ data signal Di that the $i^{th}$ data line DLi transfers depending on a switching operation of the second transistor T2 and may supply a drive current Id to the light-emitting element OLED.

The second transistor T2 is connected between the data line DLi and the first electrode of the first transistor T1. The second transistor T2 may be turned on in response to the write scan signal GWj transferred through the $j^{th}$ write scan line GWLj and may transfer, to the first electrode of the first transistor T1, the $i^{th}$ data signal Di transferred from the $i^{th}$ data line DLi.

The third transistor T3 is connected between the second electrode of the first transistor T1 and the first node N1. The third transistor T3 may be turned on in response to the $j^{th}$ compensation scan signal GCj transferred through the $j^{th}$ compensation scan line GCLj and may diode-connect the first transistor T1 by connecting the third electrode and the second electrode of the first transistor T1.

The fourth transistor T4 is connected between the first initialization voltage line VL3 to which the first initialization voltage VINT1 is applied and the first node N1. The fourth transistor T4 is turned on in response to the $j^{th}$ initialization scan signal GIj transferred through the $j^{th}$ initialization scan line GILj. The turned-on fourth transistor T4 initializes the potential of the third electrode of the first transistor T1 (that is, the potential of the first node N1) by transferring the first initialization voltage VINT1 to the third electrode of the first transistor T1.

The fifth and sixth transistors T5 and T6 are simultaneously turned on in response to the $j^{th}$ light emission control signal EMj transferred through the $j^{th}$ light emission control line ELj. The first drive voltage ELVDD applied through the turned-on fifth transistor T5 may be compensated for through the diode-connected first transistor T1 and may thereafter be transferred to the light-emitting element OLED.

The seventh transistor T7 includes a first electrode connected to the first initialization voltage line VL3 to which the first initialization voltage VINT1 is applied, a second electrode connected with the second electrode of the sixth transistor T6, and a third electrode connected with the $(j+1)^{th}$ write scan line GWLj+1. In an embodiment, the first initialization voltage VINT1 may have a negative constant voltage. In an embodiment, the first initialization voltage VINT1 may be a voltage of about −3.5 V, for example, but is not particularly limited thereto.

One end of the storage capacitor Cst is connected with the first transistor T1, and an opposite end of the storage capacitor Cst is connected with the first drive voltage line VL1. A cathode CE (refer to FIG. 7) of the light-emitting element OLED may be connected with the second drive voltage line VL2 that transfers the second drive voltage ELVSS. The second drive voltage ELVSS may have a lower voltage level than a voltage level of the first drive voltage ELVDD. In an embodiment of the invention, the second drive voltage ELVSS may have a lower voltage level than a voltage level of the first initialization voltage VINT1.

When the $j^{th}$ initialization scan signal GIj having a high level is provided through the $j^{th}$ initialization scan line GILj during an activation period of the $j^{th}$ initialization scan signal GIj, the fourth transistor T4 is turned on in response to the $j^{th}$ initialization scan signal GIj having the high level. The first initialization voltage VINT1 is transferred to the third electrode of the first transistor T1 through the turned-on fourth transistor T4, and the first node N1 is initialized to the first initialization voltage VINT1. Accordingly, the activation period of the $j^{th}$ initialization scan signal GIj may be the initialization period of the pixel PXij.

The $j^{th}$ compensation scan signal GCj is activated, and when the $j^{th}$ compensation scan signal GCj having a high level is supplied through the $j^{th}$ compensation scan line GCLj during an activation period of the $j^{th}$ compensation scan signal GCj, the third transistor T3 is turned on. The first transistor T1 is diode-connected by the turned-on third transistor T3 and is forward-biased.

Furthermore, the $j^{th}$ write scan signal GWj is activated within the activation period of the $j^{th}$ compensation scan signal GCj. The $j^{th}$ write scan signal GWj has a low level during an activation period. During the activation period of the $j^{th}$ write scan signal GWj, the second transistor T2 is turned on by the $j^{th}$ write scan signal GWj having the low level. Then, a compensation voltage (Di-Vth, where Vth is a threshold voltage of the first transistor T1) obtained by subtracting the threshold voltage of the first transistor T1 from the $i^{th}$ data signal Di supplied through the $i^{th}$ data line DLi is applied to the third electrode of the first transistor T1. That is, the potential of the third electrode of the first transistor T1 may be the compensation voltage "Di-Vth".

The first drive voltage ELVDD and the compensation voltage "Di-Vth" may be applied to the opposite ends of the storage capacitor Cst, and charges corresponding to the difference between the voltages at the opposite ends may be stored in the storage capacitor Cst. Here, the period during which the $j^{th}$ compensation scan signal GCj has the high level may be also referred to as the compensation period of the pixel PXij.

The $(j+1)^{th}$ write scan signal GWj+1 is activated. The $(j+1)^{th}$ write scan signal GWj+1 has a low level during an activation period. During the activation period of the $(j+1)^{th}$ write scan signal GWj+1, the seventh transistor T7 is turned on. A portion of the drive current Id may escape through the seventh transistor T7 as a bypass current Ibp.

The $j^{th}$ light emission control signal EMj supplied from the $j^{th}$ light emission control line ELj is changed from a high level to a low level. The fifth and sixth transistors T5 and T6 are turned on by the light emission control signal EMj having the low level. Then, the drive current Id depending on the voltage difference between the voltage of the third electrode of the first transistor T1 and the first drive voltage ELVDD is generated. The drive current Id is supplied to the light-emitting element OLED through the sixth transistor T6, and a current Ied flows through the light-emitting element OLED.

Figure 6:
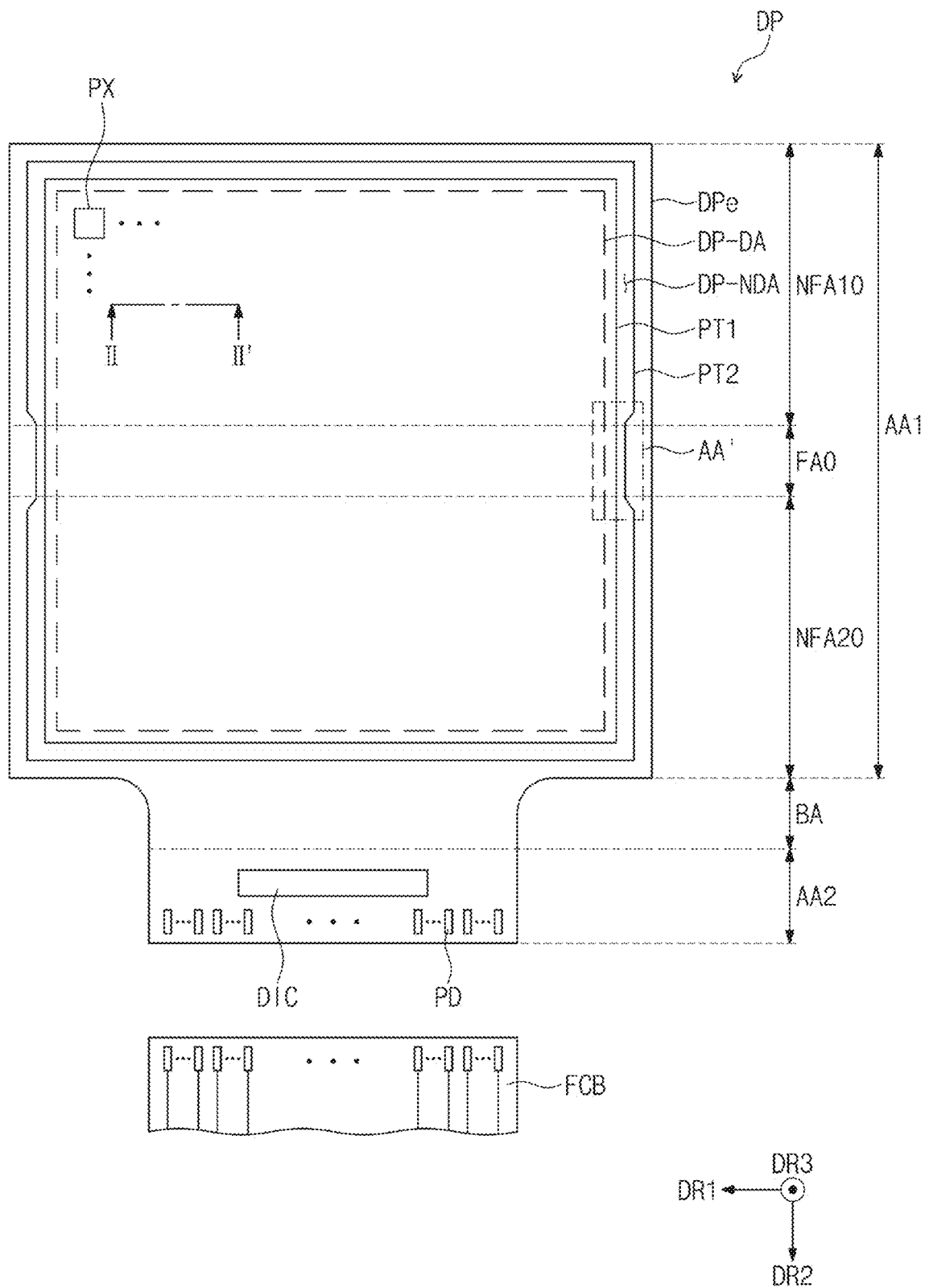
FIG. 6 is a plan view of an embodiment of a display panel according to the invention.

FIG. 6 is a plan view of an embodiment of the display panel DP according to the invention.

Referring to FIG. 6, the display area DP-DA and the non-display area DP-NDA around the display area DP-DA may be defined in the display panel DP. The display area DP-DA and the non-display area DP-NDA may be distinguished from each other depending on whether the pixels PX are disposed or not. The pixels PX are disposed in the display area DP-DA. A first protrusion PT1 and a second protrusion PT2 may be disposed in the non-display area DP-NDA.

The first protrusion PT1, in the plan view, may surround the display area DP-DA. The second protrusion PT2 may be spaced apart from the display area DP-DA with the first protrusion PT1 therebetween. The second protrusion PT2, in the plan view, may surround the first protrusion PT1.

The display panel DP may include a first panel area AA1, a bending area BA, and a second panel area AA2 that are defined in the second direction DR2. The second panel area AA2 and the bending area BA may be partial areas of the non-display area DP-NDA. The bending area BA is disposed between the first panel area AA1 and the second panel area AA2.

The first panel area AA1 is an area corresponding to the display surface DS of FIG. 1A. The first panel area AA1 may include a first non-folding area NFA10, a second non-folding area NFA20, and a folding area FA0. The first non-folding area NFA10, the second non-folding area NFA20, and the folding area FA0 correspond to the first non-folding area NFA1, the second non-folding area NFA2, and the folding area FA of FIGS. 1A and 1B, respectively.

The width of the bending area BA and the width (or, length) of the second panel area AA2 that are parallel to the first direction DR1 may be smaller than the width (or, length) of the first panel area AA1 that is parallel to the first direction DR1. An area having a smaller length in the direction of a bending axis may be more easily bent.

The driver IC DIC and pads PD, in the plan view, may be disposed adjacent to the lower end of the second panel area AA2. The flexible circuit film FCB may be electrically connected to the pads PD through an anisotropic conductive adhesive layer.

Figure 7:
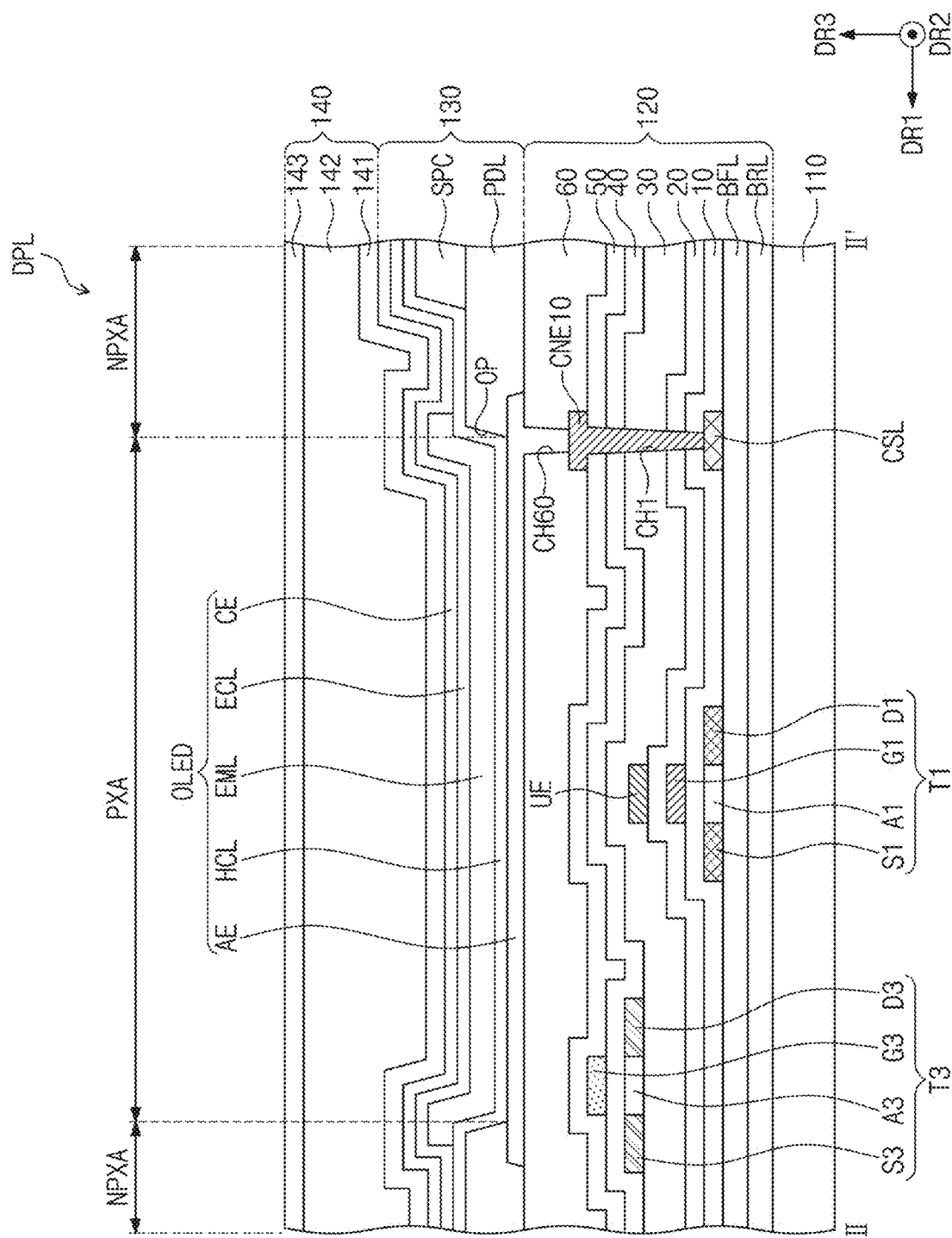
FIG. 7 is a cross-sectional view taken along line II-II' of FIG. 6.

FIG. 7 is a cross-sectional view taken along line II-II' of FIG. 6. In FIG. 7, a section of a portion of the display layer DPL is illustrated.

Referring to FIGS. 6 and 7, the display layer DPL may include a base layer 110, a circuit layer 120 disposed on the base layer 110, an element layer 130, and an encapsulation layer 140.

The base layer 110 may be a member that provides a base surface on which the circuit layer 120 is disposed. The base layer 110 may be a flexible substrate that may be bent, folded, or rolled. The first non-folding area NFA10, the second non-folding area NFA20, and the folding area FA0 may be identically defined in the base layer 110 as well. The base layer 110 may be a polymer substrate. However, without being limited thereto, the base layer 110 may be an inorganic layer, an organic layer, or a composite layer.

At least one inorganic layer is formed or disposed on the upper surface of the base layer 110. In an embodiment, the inorganic layer may include at least one of aluminum oxide, titanium oxide, silicon oxide, silicon oxy-nitride, zirconium oxide, or hafnium oxide. The inorganic layer may be formed in multiple layers. The multiple inorganic layers may constitute a barrier layer BRL and/or a buffer layer BFL that will be described below. The barrier layer BRL and the buffer layer BF may be selectively disposed.

The barrier layer BRL may prevent infiltration of foreign matter from the outside. The barrier layer BRL may include a silicon oxide layer and a silicon nitride layer. A plurality of silicon oxide layers and a plurality of silicon nitride layers may be provided. The silicon oxide layers and the silicon nitride layers may be alternately stacked one above another.

The buffer layer BFL may be disposed on the barrier layer BRL. The buffer layer BFL may improve a bonding force between the base layer 110 and a semiconductor pattern and/or a conductive pattern. The buffer layer BFL may include silicon oxide layers and silicon nitride layers. The silicon oxide layers and the silicon nitride layers may be alternately stacked one above another.

The semiconductor pattern is disposed on the buffer layer BFL. Hereinafter, the semiconductor pattern directly disposed on the buffer layer BFL is defined as the first semiconductor pattern. The first semiconductor pattern may include a silicon semiconductor. The first semiconductor pattern may include poly-silicon. However, without being limited thereto, the first semiconductor pattern may include amorphous silicon.

FIG. 7 illustrates only a portion of the first semiconductor pattern disposed on the buffer layer BFL. The first semiconductor pattern may be arranged according to a predetermined rule across pixels. The first semiconductor pattern may have different electrical properties depending on whether the first semiconductor pattern is doped or not. The first semiconductor pattern may include a first area having a high conductivity and a second area having a low conductivity. The first area may be doped with an N-type dopant or a P-type dopant. A P-type transistor may include a doped area doped with a P-type dopant, and an N-type transistor may include a doped area doped with an N-type dopant. The second area may be an undoped area, or may be an area more lightly doped than the first area.

The first area may have a higher conductivity than a conductivity of the second area and may substantially serve as an electrode or a signal line. The second area may substantially correspond to an active area (or, a channel) of a transistor. In other words, one portion of the first semiconductor pattern may be an active area of a transistor, another portion may be a source or drain of the transistor, and another portion may be a connecting electrode or a connecting signal line.

As illustrated in FIG. 7, a first electrode S1, a channel part A1, and a second electrode D1 of the first transistor T1 are formed from the first semiconductor pattern. The first electrode S1 and the second electrode D1 of the first transistor T1 extend from the channel part A1 in opposite directions.

In FIG. 7, a portion of a connecting signal line CSL formed from a semiconductor pattern is illustrated. Although not separately illustrated, the connecting signal line CSL may be connected to the second electrode of the sixth transistor T6 (refer to FIG. 5A) in the plan view.

A first insulating layer 10 may be disposed on the buffer layer BFL. The first insulating layer 10 may commonly overlap a plurality of pixels and may cover the first semiconductor pattern. The first insulating layer 10 may be an inorganic layer and/or an organic layer and may have a single-layer structure or a multi-layer structure. In an embodiment, the first insulating layer 10 may include at least one of aluminum oxide, titanium oxide, silicon oxide, silicon nitride, silicon oxy-nitride, zirconium oxide, or hafnium oxide. In this embodiment, the first insulating layer 10 may be a single layer of silicon oxide. Not only the first insulating layer 10 but also insulating layers of the circuit layer 120 to be described below may be inorganic layers and/or organic layers and may have a single-layer structure or a multi-layer structure. In an embodiment, the inorganic layers may include at least one of the aforementioned materials, but are not limited thereto.

A third electrode G1 of the first transistor T1 is disposed on the first insulating layer 10. The third electrode G1 may be a portion of a first conductive pattern. The third electrode G1 of the first transistor T1 overlaps the channel part A1 of the first transistor T1. The third electrode G1 of the first transistor T1 may function as a mask in a process of doping the first semiconductor pattern.

A second insulating layer 20 may be disposed on the first insulating layer 10 and may cover the third electrode G1 of the first transistor T1. The second insulating layer 20 may be an inorganic layer and/or an organic layer and may have a single-layer structure or a multi-layer structure. In an embodiment, the second insulating layer 20 may include at least one of silicon oxide, silicon nitride, or silicon oxy-nitride. In this embodiment, the second insulating layer 20 may have a multi-layer structure including a silicon oxide layer and a silicon nitride layer.

A third insulating layer 30 may be disposed on the second insulating layer 20. The third insulating layer 30 may have a single-layer structure or a multi-layer structure. In an embodiment, the third insulating layer 30 may have a multi-layer structure including a silicon oxide layer and a silicon nitride layer, for example. An upper electrode UE of the storage capacitor Cst may be disposed between the second insulating layer 20 and the third insulating layer 30. Furthermore, a lower electrode of the storage capacitor Cst may be disposed between the first insulating layer 10 and the second insulating layer 20.

In an embodiment of the invention, the second insulating layer 20 may be replaced with an insulating pattern. The upper electrode UE is disposed on the insulating pattern. The upper electrode UE may serve as a mask that forms the insulating pattern from the second insulating layer 20.

A second semiconductor pattern may be disposed on the third insulating layer 30. The second semiconductor pattern may include an oxide semiconductor. The oxide semiconductor may include a plurality of areas distinguished depending on whether metal oxide is reduced or not. An area where metal oxide is reduced (hereinafter, also referred to as the reduced area) has a higher conductivity than an area where metal oxide is not reduced (hereinafter, also referred to as the non-reduced area). The reduced area substantially serves as a source/drain of a transistor or a signal line. The non-reduced area substantially corresponds to an active area (or, a semiconductor area or a channel part) of the transistor. In other words, one portion of the second semiconductor pattern may be an active area of a transistor, another portion may be a source/drain area of the transistor, and another portion may be a signal transmission area.

As illustrated in FIG. 7, a first electrode S3, a channel part A3, and a second electrode D3 of the third transistor T3 are formed from the second semiconductor pattern. The first electrode S3 and the second electrode D3 include metal reduced from a metal oxide semiconductor. The first electrode S3 and the second electrode D3 may include a metal layer having a predetermined thickness from the upper surface of the second semiconductor pattern and including the reduced metal.

A fourth insulating layer 40 may be disposed on the third insulating layer 30. The fourth insulating layer 40 may commonly overlap the plurality of pixels and may cover the second semiconductor pattern. In an embodiment, the fourth insulating layer 40 may include at least one of aluminum oxide, titanium oxide, silicon oxide, silicon nitride, silicon oxy-nitride, zirconium oxide, or hafnium oxide.

A third electrode G3 of the third transistor T3 may be disposed on the fourth insulating layer 40. The third electrode G3 may be a portion of a third conductive pattern. The third electrode G3 of the third transistor T3 overlaps the channel part A3 of the third transistor T3. The third electrode G3 of the third transistor T3 may function as a mask in a process of doping the second semiconductor pattern.

In an embodiment of the invention, the fourth insulating layer 40 may be replaced with an insulating pattern. The third electrode G3 of the third transistor T3 is disposed on the insulating pattern. In this embodiment, the third electrode G3 may have the same shape as that of the insulating pattern in the plan view. Although one third electrode G3 is illustrated in this embodiment for convenience of description, the third transistor T3 may include two third electrodes.

A fifth insulating layer 50 may be disposed on the fourth insulating layer 40 and may cover the third electrode G3 of the third transistor T3. The fifth insulating layer 50 may be an inorganic layer and/or an organic layer and may have a single-layer structure or a multi-layer structure. In an embodiment, the fifth insulating layer 50 may include a silicon oxide layer and a silicon nitride layer, for example. The fifth insulating layer 50 may include a plurality of silicon oxide layers and a plurality of silicon nitride layers alternately stacked one above another.

A first connecting electrode CNE10 may be disposed on the fifth insulating layer 50. The first connecting electrode CNE10 may be connected to the connecting signal line CSL through a contact hole CH1 penetrating the first to fifth insulating layers 10, 20, 30, 40, and 50.

A sixth insulating layer 60 may be disposed on the fifth insulating layer 50. The sixth insulating layer 60 may be an organic layer. In an embodiment, the sixth insulating layer 60 may include a general purpose polymer, such as benzocyclobutene ("BCB"), polyimide, hexamethyldisiloxane ("HMDSO"), polymethylmethacrylate ("PMMA"), or polystyrene ("PS"), a polymer derivative having a phenolic group, an acrylate-based polymer, an imide-based polymer, an aryl ether-based polymer, an amide-based polymer, a fluorine-based polymer, a p-xylene-based polymer, a vinyl alcohol-based polymer, or any combinations thereof, for example.

The element layer 130 includes the light-emitting element OLED and a pixel defining film PDL. The light-emitting element OLED may include an anode AE, a hole control layer HCL, an emissive layer EML, an electron control layer ECL, and the cathode CE.

The anode AE may be disposed on the sixth insulating layer 60. The anode AE may be connected with the first connecting electrode CNE10 through a contact hole CH-60 penetrating the sixth insulating layer 60. The anode AE may be a translucent electrode, a transparent electrode, or a reflective electrode. In an embodiment, the anode AE may include a reflective layer including Ag, Mg, Al, Pt, Pd, Au, Ni, Nd, Ir, Cr, or any combinations thereof and a transparent or translucent electrode layer formed or disposed on the reflective layer. In an embodiment, the transparent or translucent electrode layer may include at least one of indium tin oxide ("ITO"), indium zinc oxide ("IZO"), indium gallium zinc oxide ("IGZO"), indium oxide ($In_2O_3$) and aluminum-doped zinc oxide ("AZO"). In an embodiment, the anode AE may include ITO/Ag/ITO, for example.

The pixel defining film PDL may be disposed on the sixth insulating layer 60. In an embodiment, the pixel defining film PDL may have a property of absorbing light. In an embodiment, the pixel defining film PDL may be black in color, for example. The pixel defining film PDL may include a black coloring agent. The black coloring agent may include a black dye or a black pigment. The black coloring agent may include carbon black, aniline black, metal such as chromium, or oxide thereof. The pixel defining film PDL may be formed by mixing a blue organic material and a black organic material. The pixel defining film PDL may additionally include a liquid-repellent organic material.

A spacer SPC is disposed on the pixel defining film PDL. The spacer SPC may be provided to prevent a dent defect by a deposition mask (e.g., a fine metal mask) used to form the emissive layer EML.

An opening OP of the pixel defining film PDL exposes at least a portion of the anode AE of the light-emitting element OLED. The opening OP of the pixel defining film PDL may define an emissive area PXA. In an embodiment, the plurality of pixels PX (refer to FIG. 4) may be disposed in the plan view of the display layer DPL according to a predetermined rule, for example. The areas where the plurality of pixels PX is disposed may be defined as the pixel areas, and one pixel area may include an emissive area PXA and a non-emissive area NPXA adjacent to the emissive area PXA. The non-emissive area NPXA may surround the emissive area PXA.

The hole control layer HCL may be commonly disposed in the emissive area PXA and the non-emissive area NPXA. A common layer, such as the hole control layer HCL, may be commonly formed for the plurality of pixels PX. The hole control layer HCL may include a hole transporting layer and a hole injection layer.

The emissive layer EML is disposed on the hole control layer HCL. The emissive layer EML may be disposed only in the area corresponding to the opening OP. The emissive layer EML may be separately formed in each of the plurality of pixels PX.

Although the patterned emissive layer EML is illustrated in this embodiment, the emissive layer EML may be commonly disposed for the plurality of pixels PX. In this case, the emissive layer EML may generate white light or blue light. Furthermore, the emissive layer EML may have a multi-layer structure.

The electron control layer ECL is disposed on the emissive layer EML. The electron control layer ECL may include an electron transporting layer and an electron injection layer. The cathode CE of the light-emitting element OLED is disposed on the electron control layer ECL. The electron control layer ECL and the cathode CE are commonly disposed for the plurality of pixels PX.

The encapsulation layer 140 is disposed on the cathode CE. The encapsulation layer 140 may cover the plurality of pixels PX (refer to FIG. 4). In this embodiment, the encapsulation layer 140 directly covers the cathode CE. In an embodiment of the invention, the display layer DPL may further include a capping layer that directly covers the cathode CE.

The encapsulation layer 140 is disposed on the element layer 130. The encapsulation layer 140 may include a first inorganic encapsulation layer 141, an organic encapsulation layer 142 disposed on the first inorganic encapsulation layer 141, and a second inorganic encapsulation layer 143 disposed on the organic encapsulation layer 142. However, without being limited thereto, in an embodiment of the invention, the encapsulation layer 140 may include a plurality of inorganic encapsulation layers and a plurality of thin organic encapsulation layers alternately stacked one above another.

The first inorganic encapsulation layer 141 and the second inorganic encapsulation layer 143 protect the light-emitting element OLED from moisture/oxygen, and the organic encapsulation layer 142 protects the light-emitting element OLED from foreign matter such as dust particles. The first inorganic encapsulation layer 141 and the second inorganic encapsulation layer 143 may include, but is not particularly limited to, a silicon nitride layer, a silicon oxy-nitride layer, a silicon oxide layer, a titanium oxide layer, or an aluminum oxide layer. The organic encapsulation layer 142 may include, but is not particularly limited to, an acrylate-based organic layer.

Figure 8:
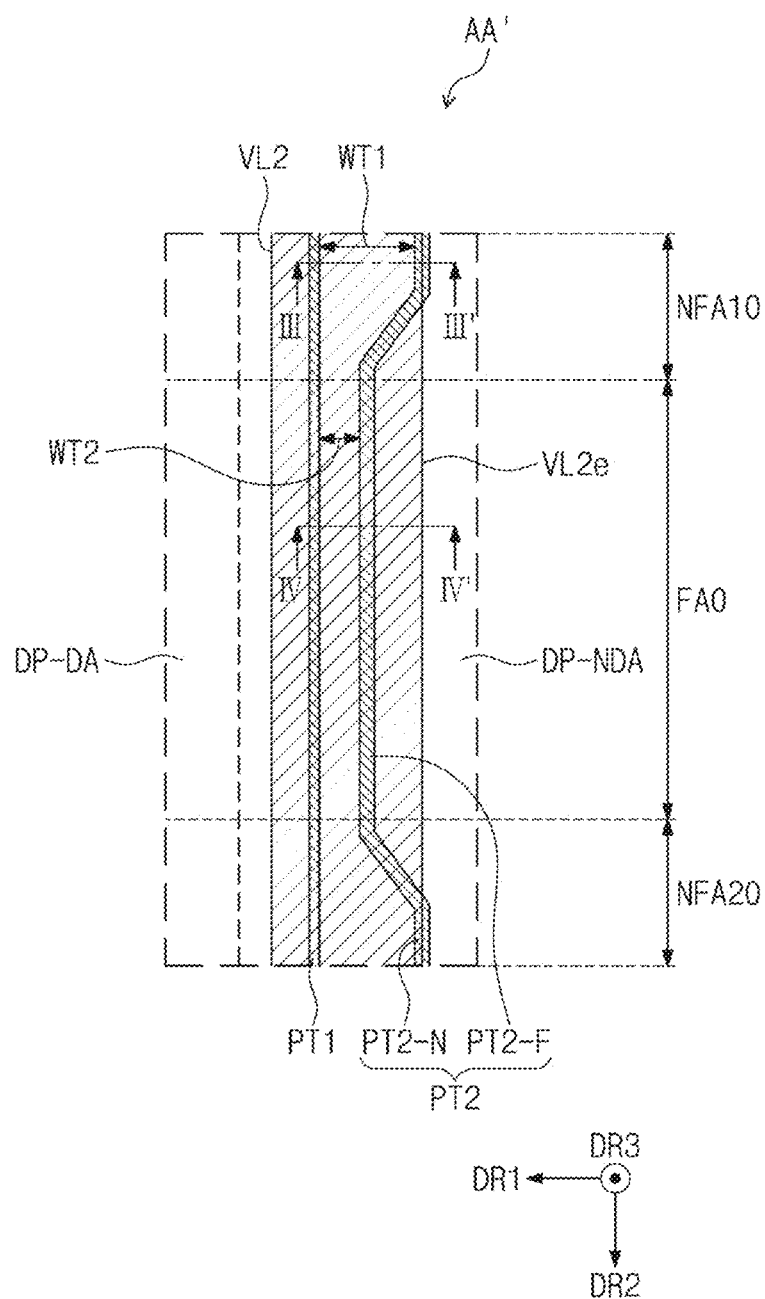
FIG. 8 is an enlarged plan view illustrating area AA' of FIG. 6.
Figure 9A:
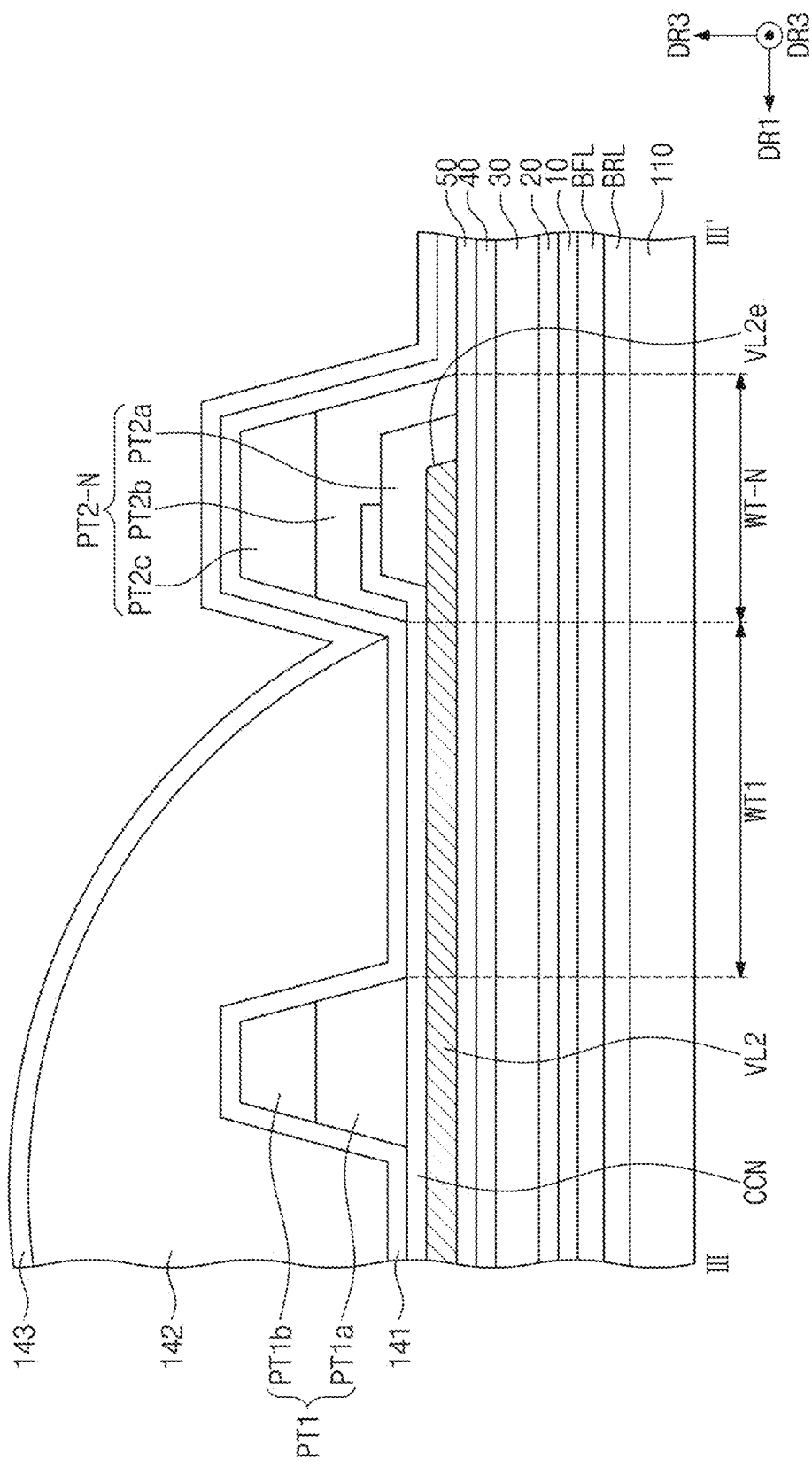
FIG. 9A is a cross-sectional view taken along line III-III' of FIG. 8.
Figure 9B:
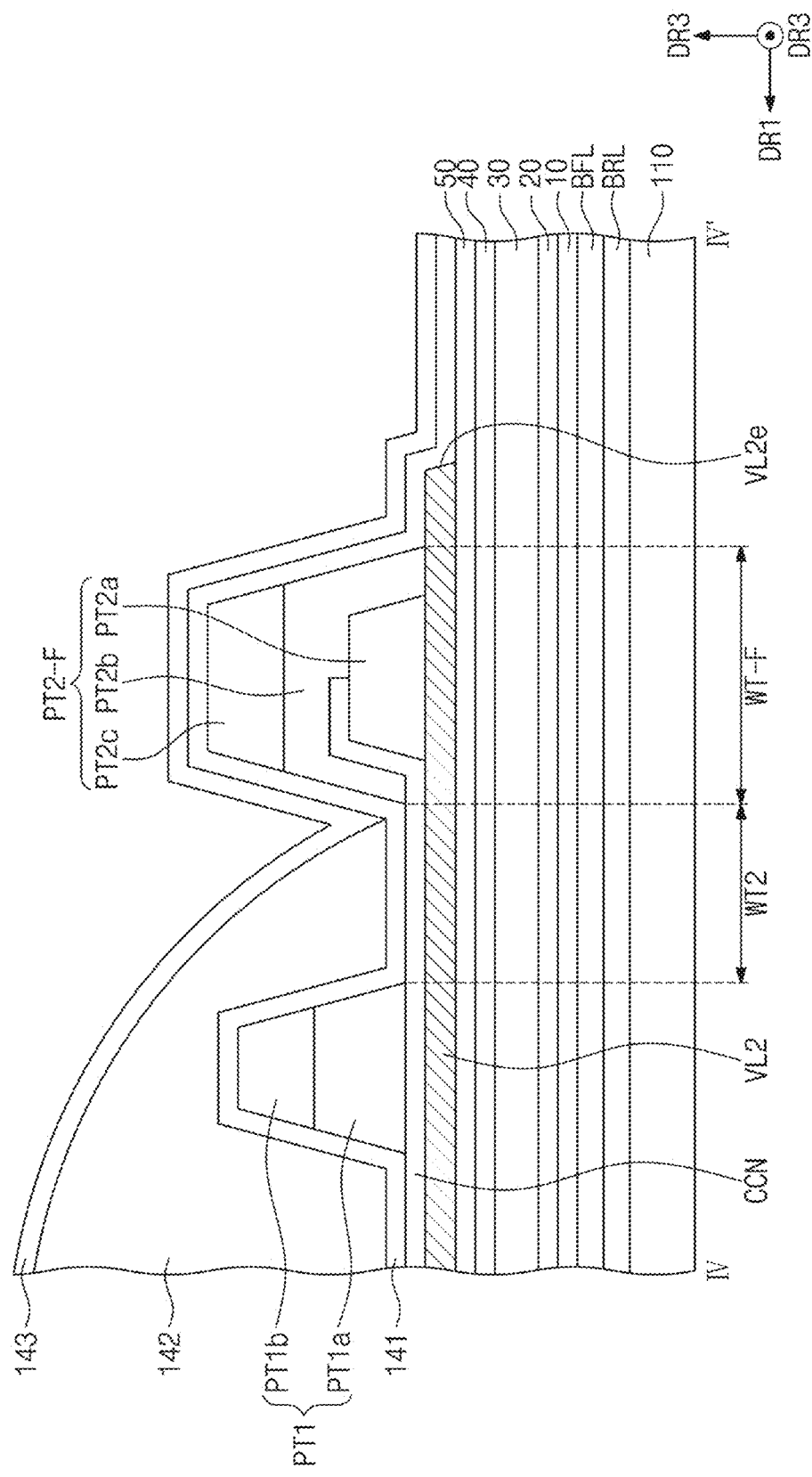
FIG. 9B is a cross-sectional view taken along line IV-IV' of FIG. 8.

FIG. 8 is an enlarged plan view illustrating area AA' of FIG. 6. FIG. 9A is a cross-sectional view taken along line III-III' of FIG. 8. FIG. 9B is a cross-sectional view taken along line IV-IV' of FIG. 8.

Referring to FIGS. 8, 9A, and 9B, the second drive voltage line VL2 (hereinafter, also referred to as the drive voltage line) may be disposed on the base layer 110. In an embodiment, the drive voltage line VL2 may be disposed on the fifth insulating layer 50, for example. Furthermore, the drive voltage line VL2 may be disposed in the non-display area DP-NDA. The drive voltage line VL2 may be electrically connected with the cathode CE (refer to FIG. 7) through a connecting electrode CCN. The connecting electrode CCN may include the same material as that of the anode AE (refer to FIG. 7) and may be formed through the same process as the anode AE. However, the invention is not particularly limited thereto. The drive voltage line VL2 may be also referred to as the drive voltage electrode, the second drive voltage electrode, or the common voltage electrode.

Both the first protrusion PT1 and the second protrusion PT2 may overlap the drive voltage line VL2. In this embodiment, the display layer DPL is illustrated as including the first protrusion PT1 and the second protrusion PT2. However, the display layer DPL may further include additional protrusions. In an embodiment, the additional protrusions may be provided between the first protrusion PT1 and the second protrusion PT2, or may be provided between the display area DP-DA and the first protrusion PT1, for example.

Each of the first protrusion PT1 and the second protrusion PT2 may be disposed on the drive voltage line VL2. The first protrusion PT1 may include a 1-1 sub-layer PT1a and a 1-2 sub-layer PT1b. The second protrusion PT2 may include a 2-1 sub-layer PT2a, a 2-2 sub-layer PT2b, and a 2-3 sub-layer PT2c. The 2-1 sub-layer PT2a may include the same material as that of the sixth insulating layer 60 (refer to FIG. 7) and may be formed through the same process as the sixth insulating layer 60. The 1-1 sub-layer PT1a and the 2-2 sub-layer PT2b may include the same material as that of the pixel defining film PDL (refer to FIG. 7) and may be formed through the same process as the pixel defining film PDL. The 1-2 sub-layer PT1b and the 2-3 sub-layer PT2c may include the same material as that of the spacer SPC (refer to FIG. 7) and may be formed through the same process as the spacer SPC.

The first protrusion PT1 and the second protrusion PT2 may be covered by the first inorganic encapsulation layer 141. The organic encapsulation layer 142 may be formed by applying a monomer. In an embodiment, because the monomer has flowability, an inkjet process may be used when the monomer is applied, for example. In this case, the position of the monomer may be controlled by the first protrusion PT1 and the second protrusion PT2 such that the monomer does not flow beyond a desired area. The first protrusion PT1 and the second protrusion PT2 may be also referred to as the first dam and the second dam, respectively. The second inorganic encapsulation layer 143 may cover the first protrusion PT1 and the second protrusion PT2 after the organic encapsulation layer 142 is formed. The first protrusion PT1 and the second protrusion PT2 may serve to block a path along which moisture or air is laterally introduced.

Referring to FIG. 8, a portion of the first protrusion PT1 may extend in the second direction DR2. The portion of the first protrusion PT1 may have a straight shape across the first non-folding area NFA10, a folding area FA0, and a second non-folding area NFA20. The second protrusion PT2 may include first protruding portions PT2-N and a second protruding portion PT2-F. A portion of the second protrusion PT2 may have a shape bent toward the first protrusion PT1. The portion of the second protrusion PT2 that overlaps the folding area FA0 may be defined as the second protruding portion PT2-F, and the portions of the second protrusion PT2 that overlap the first and second non-folding areas NFA10 and NFA20, respectively, may be defined as the first protruding portions PT2-N.

The second protruding portion PT2-F may be closer to the display area DP-DA than the first protruding portions PT2-N is. The first gaps WT1 between the first protrusion PT1 and the first protruding portions PT2-N may be greater than the second gap WT2 between the first protrusion PT1 and the second protruding portion PT2-F. The first gaps WT1 and the second gap WT2 may be gaps parallel to the first direction DR1.

In an embodiment of the invention, the second protrusion PT2 disposed in the folding area FA0 may be bent in a direction away from an edge DPe (refer to FIG. 6) of the display panel DP. Accordingly, the second gap WT2 between the first protrusion PT1 and the second protrusion PT2 in the portion overlapping the folding area FA0 may be smaller than the first gap WT1 between the first protrusion PT1 and the second protrusion PT2 in the portion overlapping the first or second non-folding area NFA10 or NFA20.

When the electronic device ED (refer to FIG. 1A) is repeatedly folded and unfolded, a stress difference in the thickness direction (e.g., the third direction DR3) between positions in the plan view within the display panel DP may occur due to a difference in boundary condition or a deviation in alignment, and therefore a crease may be generated. In this case, the greatest stress may be generated at the outermost portion, e.g., at the edge DPe of the display panel DP of FIG. 6. In an embodiment, when the crease overlaps a protruding component, the imbalance in stress between the positions within the display panel DP may be further increased, and therefore a defect, such as a crack, may be caused, for example.

In an embodiment of the invention, the portion of the second protrusion PT2 that overlaps the folding area FA0 has a shape bent in the direction away from the edge DPe of the display panel DP. Accordingly, even when the electronic device ED (refer to FIG. 1A) is repeatedly folded and unfolded so that the crease is generated, the probability that the crease overlaps the second protrusion PT2 may be reduced. Thus, the stress imbalance may be reduced, and the defect due to the stress imbalance may be reduced or prevented.

The widths WT-N of the first protruding portions PT2-N may be substantially the same as the width WT-F of the second protruding portion PT2-F. However, the invention is not particularly limited thereto. In an embodiment, the width WT-F of the second protruding portion PT2-F may be smaller than the widths WT-N of the first protruding portions PT2-N, for example. In this case, the second protruding portion PT2-F may be spaced farther away from the edge DPe (refer to FIG. 6) of the display panel DP.

The widths of portions of the drive voltage line VL2 that overlap the first non-folding area NFA10 and the second non-folding area NFA20, respectively, may be the same as the width of a portion of the drive voltage line VL2 that overlaps the folding area FA0. When the first non-folding area NFA10, the folding area FA0, and the second non-folding area NFA20 are sequentially defined in the second direction DR2, the widths may refer to widths parallel to the first direction DR1 crossing the second direction DR2.

In the plan view, an entirety of the first protrusion PT1 may overlap the drive voltage line VL2. In the plan view, a portion of the second protrusion PT2 may overlap the drive voltage line VL2. In an embodiment, the first protruding portions PT2-N may overlap an edge VL2e of the drive voltage line VL2, and the second protruding portion PT2-F may be spaced apart from the edge VL2e of the drive voltage line VL2 and may overlap the drive voltage line VL2, for example.

Figure 10:
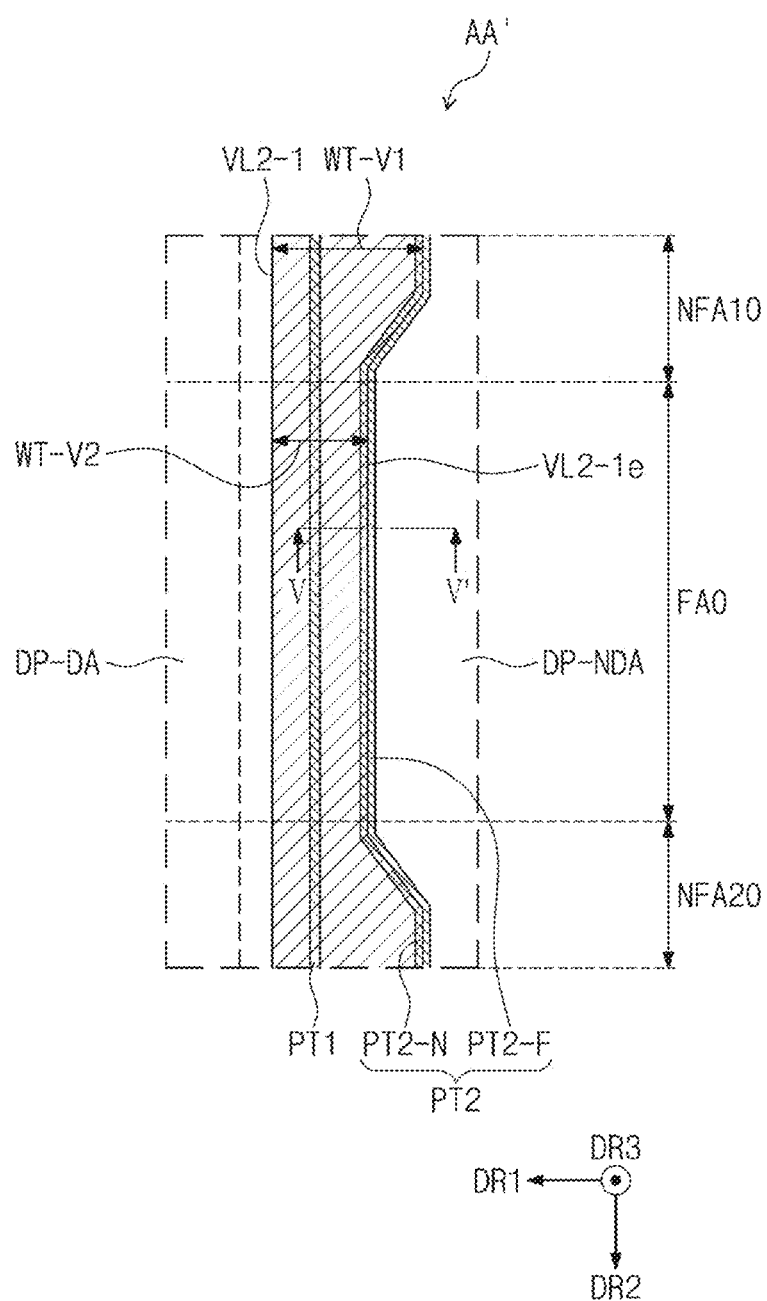
FIG. 10 is an enlarged plan view illustrating area AA' of FIG. 6.
Figure 11:
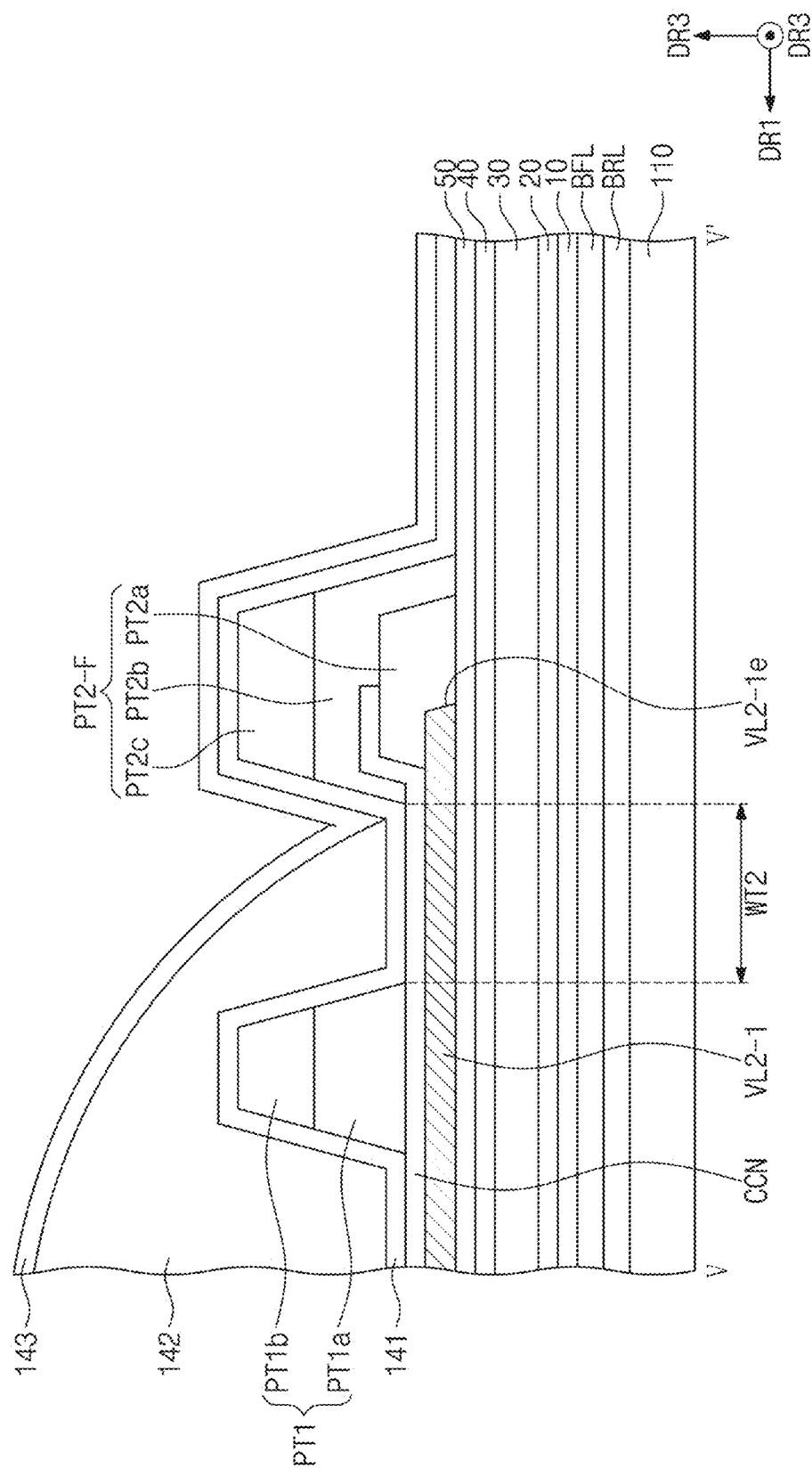
FIG. 11 is a cross-sectional view taken along line V-V' of FIG. 10.

FIG. 10 is an enlarged plan view illustrating area AA' of FIG. 6. FIG. 11 is a cross-sectional view taken along line V-V' of FIG. 10. In describing FIGS. 10 and 11, only the difference from FIGS. 8, 9A, and 9B will be described. Identical components will be assigned with identical reference numerals, and descriptions thereabout will be omitted.

Referring to FIGS. 10 and 11, the widths WT-V1 of portions of a drive voltage line VL2-1 that overlap the first non-folding area NFA10 and the second non-folding area NFA20, respectively, may be greater than the width WT-V2 of a portion of the drive voltage line VL2-1 that overlaps the folding area FA0. In an embodiment, an edge VL2-1e of the drive voltage line VL2-1 may have a shape corresponding to the shape of the second protrusion PT2, for example. Accordingly, the first protruding portions PT2-N and the second protruding portion PT2-F may overlap the edge VL2-1e of the drive voltage line VL2-1.

In an embodiment of the invention, a portion of the second protrusion PT2 that overlaps the folding area FA0 has a shape bent in a direction away from the edge DPe (refer to FIG. 6) of the display panel DP. Accordingly, even when the electronic device ED (refer to FIG. 1A) is repeatedly folded and unfolded so that a crease is generated, the probability that the crease overlaps the second protrusion PT2 may be reduced. Thus, an imbalance in stress may be reduced, and a defect due to the stress imbalance may be reduced or prevented. Furthermore, as the edge VL2-1e of the drive voltage line VL2-1 has a shape corresponding to the shape of the second protrusion PT2, the height of the uppermost surface of the second protruding portion PT2-F may be substantially the same as the heights of the uppermost surfaces of the first protruding portions PT2-N even when the second protrusion PT2 has a shape bent in the direction away from the edge DPe of the display panel DP.

Figure 12:
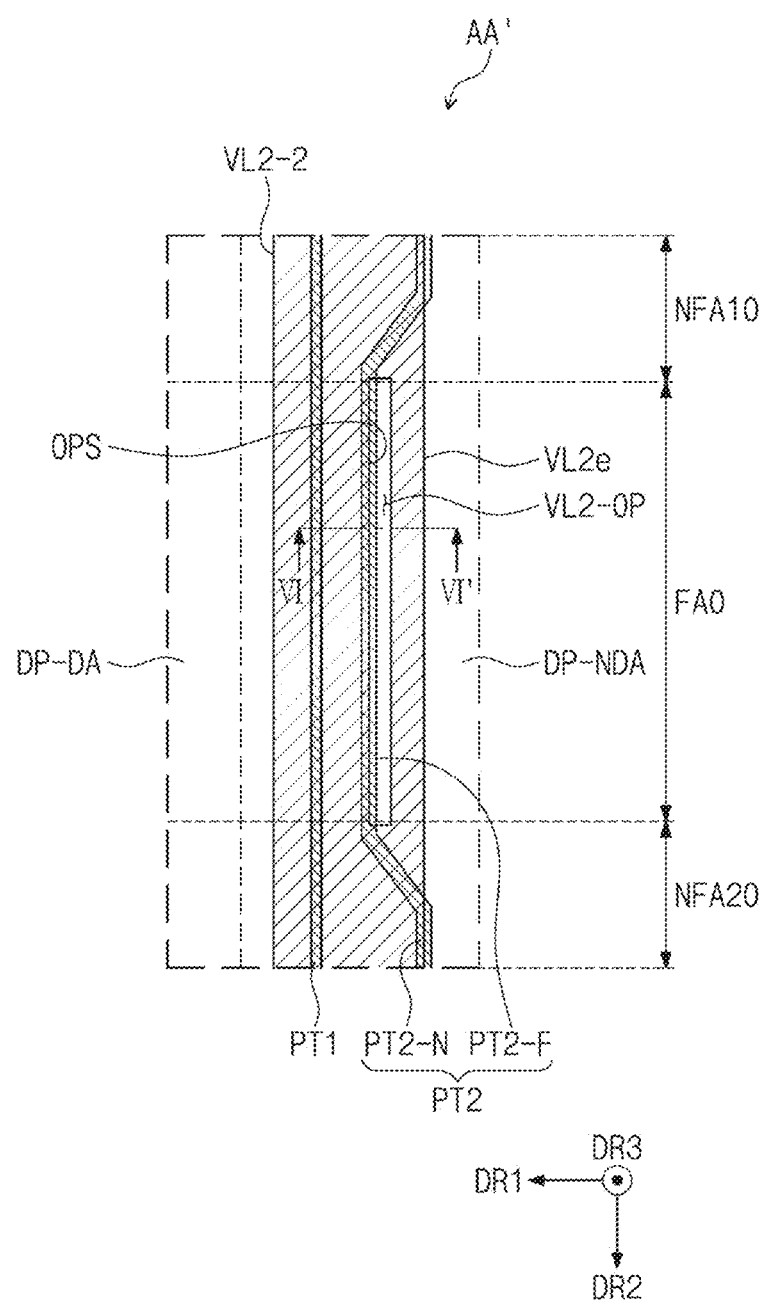
FIG. 12 is an enlarged plan view illustrating area AA' of FIG. 6.
Figure 13:
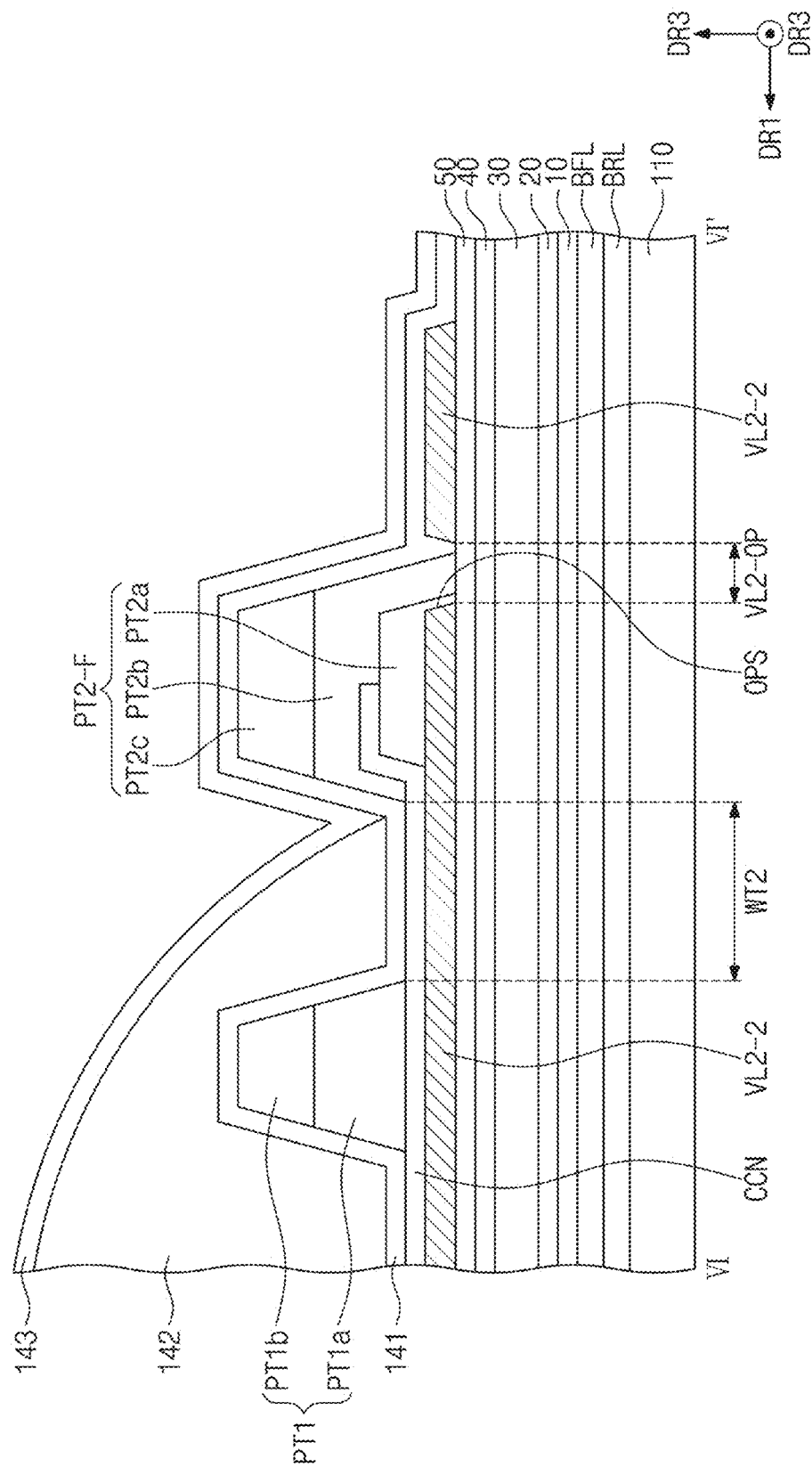
FIG. 13 is a cross-sectional view taken along line VI-VI' of FIG. 12.

FIG. 12 is an enlarged plan view illustrating area AA' of FIG. 6. FIG. 13 is a cross-sectional view taken along line VI-VI' of FIG. 12. In describing FIGS. 12 and 13, only the difference from FIGS. 8, 9A, and 9B will be described. Identical components will be assigned with identical reference numerals, and descriptions thereabout will be omitted.

Referring to FIGS. 12 and 13, an opening VL2-OP may be defined in a portion of a drive voltage line VL2-2 that overlaps the folding area FA0. The first protruding portions PT2-N may overlap an edge VL2e of the drive voltage line VL2-2, and the second protruding portion PT2-F may overlap a sidewall OPS defining the opening VL2-OP. The sidewall OPS may be spaced farther away from the display area DP-DA than the second protruding portion PT2-F is.

In an embodiment of the invention, a portion of the second protrusion PT2 that overlaps the folding area FA0 has a shape bent in a direction away from the edge DPe (refer to FIG. 6) of the display panel DP. Accordingly, even when the electronic device ED (refer to FIG. 1A) is repeatedly folded and unfolded so that a crease is generated, the probability that the crease overlaps the second protrusion PT2 may be reduced. Thus, an imbalance in stress may be reduced, and a defect due to the stress imbalance may be reduced or prevented. Furthermore, as the opening VL2-OP defined by the sidewall OPS overlapping the second protruding portion PT2-F is defined in the drive voltage line VL2-1, the height of the uppermost surface of the second protruding portion PT2-F may be substantially the same as the heights of the uppermost surfaces of the first protruding portions PT2-N even when the second protrusion PT2 has a shape bent in the direction away from the edge DPe of the display panel DP. In addition, a voltage ("IR") drop of the drive voltage line VL2-2 may be decreased, compared to the IR drop of the drive voltage line VL2-1 illustrated in FIGS. 10 and 11.

By the embodiments of the invention, the first protrusion and the second protrusion adjacent to the first protrusion may be disposed in the non-display area of the display panel. The portion of the second protrusion that overlaps the folding area has a shape bent in the direction away from the edge of the display panel. Accordingly, even when the electronic device is repeatedly folded and unfolded so that a crease is generated, the probability that the crease overlaps the second protrusion may be reduced. Thus, an imbalance in stress between positions within the display panel may be reduced, and a defect due to the stress imbalance may be reduced or prevented.

While the invention has been described with reference to embodiments thereof, it will be apparent to those of ordinary skill in the art that various changes and modifications may be made thereto without departing from the spirit and scope of the invention as set forth in the following claims.

What is claimed is:
1. An electronic device comprising:
   a display panel in which a display area and a non-display area adjacent to the display area are defined, the display panel including:
      a base layer in which a first non-folding area, a second non-folding area, and a folding area between the first non-folding area and the second non-folding area are defined;
      a plurality of pixels disposed on the base layer and disposed in the display area;
      a first protrusion disposed on the base layer and disposed in the non-display area; and
      a second protrusion disposed on the base layer and disposed in the non-display area, the second protrusion surrounding the first protrusion,
   wherein a first gap defined between the first protrusion and the second protrusion overlapping the first non-folding area is greater than a second gap defined between the first protrusion and the second protrusion overlapping the folding area,
   wherein the first non-folding area, the folding area, and the second non-folding area are sequentially defined in a first direction,
   wherein the second protrusion includes first protruding portions disposed in the first non-folding area and the second non-folding area, respectively, and a second protruding portion disposed in the folding area and extending from the first protruding portions, and the second protruding portion is closer to the display area than the first protruding portions are, and wherein the second protruding portion has a straight shape extending in the first direction.

2. The electronic device of claim 1, wherein each of the first gap and the second gap is a gap between the first protrusion and the second protrusion spaced apart from each other in a second direction crossing the first direction.

3. The electronic device of claim 1, wherein in a plan view, the first protrusion is disposed between the display area and the second protrusion and surrounds the display area.

4. The electronic device of claim 1, wherein the display panel further includes a drive voltage line which transfers a drive voltage to the plurality of pixels, and the drive voltage line is disposed in the non-display area.

5. The electronic device of claim 4, wherein the drive voltage line overlaps the first protrusion and the second protrusion in a plan view.

6. The electronic device of claim 4, wherein portions of the drive voltage line which overlap the first non-folding area and the second non-folding area, respectively, and have a width equal to a width of a portion of the drive voltage line which overlaps the folding area.

7. The electronic device of claim 6, wherein the first protruding portions overlap an edge of the drive voltage line, and the second protruding portion is spaced apart from the edge of the drive voltage line and overlaps the drive voltage line.

8. The electronic device of claim 4, wherein portions of the drive voltage line which overlap the first non-folding area and the second non-folding area, respectively, have a greater width than a portion of the drive voltage line which overlaps the folding area.

9. The electronic device of claim 8, wherein each of the first protruding portions and the second protruding portion overlaps an edge of the drive voltage line.

10. The electronic device of claim 4, wherein an opening is defined in a portion of the drive voltage line which overlaps the folding area.

11. The electronic device of claim 10, wherein the first protruding portions overlap an edge of the drive voltage line, and the second protruding portion overlaps a sidewall which defines the opening.

12. The electronic device of claim 11, wherein the sidewall is spaced farther away from the display area than the second protruding portion is.

13. The electronic device of claim 1, wherein a portion of the first protrusion which faces the first protruding portions and the second protruding portion has a straight shape extending in the first direction.

14. The electronic device of claim 1, further comprising:
a window disposed on the display panel; and
a lower member disposed under the display panel,
wherein the display panel further includes:
a first inorganic encapsulation layer which covers the plurality of pixels, the first protrusion, and the second protrusion;
an organic encapsulation layer disposed on the first inorganic encapsulation layer; and
a second inorganic encapsulation layer disposed on the organic encapsulation layer.

15. A display panel comprising:
a base layer in which a first non-folding area, a second non-folding area, and a folding area between the first non-folding area and the second non-folding area are defined;
a plurality of pixels disposed on the base layer;
a first protrusion disposed on the base layer and surrounding a display area in which the plurality of pixels is disposed;
a second protrusion disposed on the base layer and surrounding the first protrusion, the second protrusion including first protruding portions disposed in the first non-folding area and the second non-folding area, respectively, and a second protruding portion disposed in the folding area and extending from the first protruding portions, wherein the second protruding portion is closer to the display area than the first protruding portions are; and
a drive voltage line which transfers a drive voltage to the plurality of pixels and overlaps the first protrusion and the second protrusion in a plan view,
wherein the first non-folding area, the folding area, and the second non-folding area are sequentially defined in a first direction, and
wherein the second protruding portion has a straight shape extending in the first direction.

16. The display panel of claim 15, wherein portions of the drive voltage line which overlap the first non-folding area and the second non-folding area, respectively, have a width equal to a width of a portion of the drive voltage line which overlaps the folding area, the first protruding portions overlap an edge of the drive voltage line, and the second protruding portion is spaced apart from the edge of the drive voltage line and overlaps the drive voltage line.

17. The display panel of claim 15, wherein portions of the drive voltage line which overlap the first non-folding area and the second non-folding area, respectively, have a greater width than a portion of the drive voltage line which overlaps the folding area, and each of the first protruding portions and the second protruding portion overlaps an edge of the drive voltage line.

18. The display panel of claim 15, wherein an opening is defined in a portion of the drive voltage line which overlaps the folding area, the first protruding portions overlap an edge of the drive voltage line, and the second protruding portion overlaps a sidewall which defines the opening.

19. The display panel of claim 15, wherein a portion of the first protrusion which faces the first protruding portions and the second protruding portion has a straight shape extending in the first direction.

* * * * *